United States Patent
Jiang et al.

(10) Patent No.: US 8,245,094 B2
(45) Date of Patent: *Aug. 14, 2012

(54) RANK MODULATION FOR FLASH MEMORIES

(75) Inventors: Anxiao Jiang, College Station, TX (US);
Robert Mateescu, Pasadena, CA (US);
Moshe Schwartz, Rehovot (IL);
Jehoshua Bruck, La Canada, CA (US)

(73) Assignee: California Institute of Technology Texas A & M, Pasadena, CA (US)

( * ) Notice: Subject to any disclaimer, the term of this patent is extended or adjusted under 35 U.S.C. 154(b) by 857 days.

This patent is subject to a terminal disclaimer.

(21) Appl. No.: 12/275,186

(22) Filed: Nov. 20, 2008

(65) Prior Publication Data

US 2009/0132758 A1 May 21, 2009

Related U.S. Application Data

(60) Provisional application No. 61/010,803, filed on Jan. 11, 2008, provisional application No. 61/003,865, filed on Nov. 20, 2007.

(51) Int. Cl.
*H03M 13/00* (2006.01)
(52) U.S. Cl. ......... 714/752; 714/758; 714/781; 711/103
(58) Field of Classification Search .................. 714/781, 714/752, 758; 711/103
See application file for complete search history.

(56) References Cited

U.S. PATENT DOCUMENTS

| | | | |
|---|---|---|---|
| 2,632,058 | A | 3/1953 | Gray |
| 3,196,351 | A | 7/1965 | Slepian |
| 5,832,493 | A | 11/1998 | Marshall et al. |
| 6,266,279 | B1 | 7/2001 | Yoshimura |
| 6,535,949 | B1 | 3/2003 | Parker |
| 2002/0118573 | A1 | 8/2002 | Pasotti et al. |
| 2005/0237798 | A1 | 10/2005 | Urabe et al. |

OTHER PUBLICATIONS

2008 IEEE International Symposium on Information Theory (ISIT2008), Toronto, Ontario, Canada, poster, retrieved off the internet at URL http://www.isit2008.org/ on Oct. 20, 2009.

Aleph One, "YAFFS: Yet another flash filing system . . . ", Cambridge, UK, 2002, retrieved from the Internet at http://web.archive.org/web/20040217235559/http:/www.aleph1.co.uk/yaffs/index.html as posted on Feb. 17, 2004. The YAFFS material has been moved to www.yaffs.net.

Aritome, S. et al., "Reliability issues of flash memory cells", Proceedings of the IEEE, 81(5):776-788 May 1993.

Baer, M. B., "Optimal prefix codes for infinite alphabets with nonlinear costs", IEEE Trans. on Inform. Theory, 54(3):1273-1286, Mar. 2008.

Berger, T. et al., "Permutation codes for sources", IEEE Trans. on Inform. Theory, IT-18(1):160-169, Jan. 1972.

Birrell, A. et al., "A design for high performance flash disks," ACM Operating Systems Review, 41(2):88-93, Apr. 2007.

(Continued)

*Primary Examiner* — Sam Rizk
(74) *Attorney, Agent, or Firm* — Kilpatrick Townsend & Stockton LLP

(57) ABSTRACT

We investigate a novel storage technology, Rank Modulation, for flash memories. In this scheme, a set of n cells stores information in the permutation induced by the different charge levels of the individual cells. The resulting scheme eliminates the need for discrete cell levels, and overshoot errors when programming cells (a serious problem that reduces the writing speed), as well as mitigate the problem of asymmetric errors. We present schemes for Gray codes, rewriting and joint coding in the rank modulation paradigm.

58 Claims, 14 Drawing Sheets

OTHER PUBLICATIONS

Blaum, M. et al., "Interleaving schemes for multidimensional cluster errors", IEEE Transactions on Information Theory, 44(2):730-743, Mar. 1998.

Bohossian, V. et al., "Buffer coding for asymmetric multi-level memory", IEEE International Symposium on Information Theory (ISIT2007), Nice, France, pp. 1186-1190, Jun. 2007.

Cappelletti, P. et al., Chapter 5, "Memory Architecture and Related Issues" in Flash memories, Kluwer Academic Publishers, pp. 241-360,1st Edition (1999).

Cappelletti, P. et al., Chapter 6, "Multilevel Flash Memories", in Flash Memories, Kluwer Academic Publishers, pp. 361-397, 1st Edition (1999).

Cohen, G. D. et al., "Linear binary code for write-once memories", IEEE Trans. on Inform. Theory, IT-32(5):697-700, Sep. 1986.

Dan, R. et al., "A TrueFFS® and FLite™ technical overview of M-systems' flash file systems", Technical Report 80-SR-002-00-6L Rev. 1.30, Mar. 1997, 14 pages.

Dietz, P., "Optimal algorithms for list indexing and subset rank", from Lecture Notes in Computer Science, G. Goos, ed., at 39-46, Springer-Verlag London, UK (1989).

Douglis, F. et al., Proceedings of the First USENIX Symposium on Operating Systems Design and Implementation (OSDI), pp. 25-37, Monterey, CA, Nov. 14-17, 1994.

Fiat, A. et al., "Generalized 'write-once' memories", IEEE Trans. on Inform. Theory, IT-30(3):470-480, May 1984.

Fu, F. et al., "On the capacity of generalized write-once memory with state transitions described by an arbitrary directed acyclic graph," 45(1):308-313, Jan. 1999.

Gal, E. et al., "Algorithms and data structures for flash memories", ACM Computing Surveys, 37(2):138-163, Jun. 2005.

Golin, M. J. et al., "A dynamic programming algorithm for constructing optimal prefix-free codes with unequal letter costs", IEEE Trans. on Inform. Theory, 44(5):1770-1781, Sep. 1998.

Golomb, S. W. et al., "Perfect codes in the Lee metric and the packing of polyominoes", SIAM J. Appl. Math., 18(2):302-317, Jan. 1970.

Hall, M. Jr. et al., "Combinatorial analysis and computers", Amer. Math. Monthly, 72(2):21-28, (1965).

Heegard, C. et al., "On the capacity of computer memory with defects", IEEE Trans. on Inform. Theory, IT-29(5):731-739, (Sep. 1983).

Heegard, C., "On the capacity of permanent memory", IEEE Trans. on Inform. Theory, IT-31(1):34-42, Jan. 1985.

Huffman, D. A. "A method for the construction of minimum-redundancy codes", Proceedings of the Institute of Radio Engineers, 40(9):1098-1101, Sep. 1952.

Hwang, F. K., "Generalized Huffman trees", SIAM J. Appl. Math., 37(1):124-127, Aug. 1979.

Jiang, A. et al., "Floating codes for joint information storage in write asymmetric memories", Proceedings of the 2007 IEEE International Symposium on Information Theory (ISIT2007), Nice, France, pp. 1166-1170, Jun. 2007.

Jiang, A. et al., "Joint coding for flash memory storage", Proceedings of the 2008 IEEE International Symposium on Information Theory (ISIT2008), Toronto, Canada, pp. 1741-1745, Jul. 6-11, 2008.

Jiang, A., "On the generalization of error-correcting WOM codes", Proceedings of the 2007 IEEE International Symposium on Information Theory (ISIT2007), Nice, France, pp. 1391-1395, Jun. 2007.

Knuth, D. E., "The art of computer programming", vol. 3: Sorting and Searching, Addison Wesley, Reading, MA, 2nd ed., (1998), Section 5.2.4 at pp. 158-168, Section 6.2.2 at pp. 426-448.

Kuznetsov, A. et al., "On the general defective channel with informed encoder and capacities of some constrained memories", IEEE Trans. on Inform. Theory, 40(6):1866-1871, Nov. 1994.

Lehmer, D. H., "Teaching combinatorial tricks to a computer", Proc. Sympos. Appl. Math. Combinatorial Analysis, 10:179-193 (1960).

Mares, M. et al., "Linear-time ranking of permutations", Algorithms-ESA, pp. 187-193 (2007).

Myrvold, W. et al., "Ranking and unranking permutations in linear time", Information Processing Letters, 79(6):1-6, Apr. 13, 2000.

Orlov, S. et al., "Error correcting sparse permutation channel codes for digital holographic data storage", Proceeding of the SPIE, The International Society for Optical Engineering, vol. 6620, May 20, 2007, pp. 662026-1-662026-8.

Pavan, P. et al., "Flash memory cells—an overview", Proceedings of the IEEE, 85(8):1248-1271, Aug. 1997.

Rivest, R. L. et al., "How to reuse a 'write-once' memory", Information and Control, 55:1-19 (1982).

Sedgewick, R., "Permutation generation methods", Computing Surveys, 9(2):137-164, Jun. 1977.

Slepian, D., "Permutation modulation", Proc. of the IEEE, 53(3):228-236 (1965).

"SanDisk launches 64 gigabyte solid state drives for notebook PCs, meeting needs for higher capacity," Press Release, Business Wire, Jun. 5, 2007, 5 pages.

Web article entitled "PQI unveils 256GB solid state drive," retrieved from the Internet at URL http://web.archive.org/web/20070603192642/www.guru3d.com/news.html as posted on Jun. 4, 2007.

Wolf, J. K. et al., "Coding for a write-once memory", AT&T Bell Laboratories Technical Journal 63(6):1089-1112, Jul.-Aug. 1984.

Woodhouse, D., "JFFS: The journaling flash file system," Ottawa Linux Symposium, 2001, 12 pages.

Savage, "A survey of combinatorial gray codes," SIAM Review, vol. 39, No. 4, pp. 605-629, Dec. 1997.

International Search Report dated Apr. 29, 2009 for PCT application No. PCT/US2008/084249.

| Order of cell levels | Ternary variable |
|---|---|
| (1,2,3) → | 1 |
| (1,3,2) → | 1 |
| (2,1,3) → | 2 |
| (2,3,1) → | 2 |
| (3,1,2) → | 3 |
| (3,2,1) → | 3 |

US 8,245,094 B2

RANK MODULATION FOR FLASH MEMORIES

CROSS-REFERENCES TO RELATED APPLICATIONS

This application claims the benefit of U.S. Provisional Application Ser. No. 61/010,803 entitled "Rank Modulation for Flash Memories" by Anxiao Jiang, Robert Mateescu, Moshe Schwartz, and Jehoshua Bruck filed Jan. 11, 2008 and claims the benefit of U.S. Provisional Application Ser. No. 61/003,865 entitled "BRAM: Balanced RAnk Modulation for Data Storage in Flash Memories" by Anxiao Jiang and Jehoshua Bruck filed Nov. 20, 2007. Priority of the filing dates is hereby claimed, and the disclosures of the prior applications are hereby incorporated by reference. This application is related to U.S. Application entitled "Error Correcting Codes for Rank Modulation" by Anxiao Jiang et al. filed Nov. 20, 2008. The disclosure of this application is incorporated by reference.

BACKGROUND

The present invention relates to data storage devices and, more particularly, to data modulation techniques in data storage devices such as flash memory devices.

Flash memories are by far the most important type of electronic non-volatile memories (NVMs), accounting for nearly 90% of the NVM market. See, for example, the Web site of Saifun Semiconductors Ltd. (available at www.saifun.com) and Web-Feet Research, Inc. (available at www.web-feetresearch.com). Today, billions of flash memories are used in mobile, embedded, and mass-storage systems, mainly because of their high performance and physical durability. See, for example, P. Cappelletti et al., Chapter 5, "Memory Architecture and Related Issues" in *Flash memories*, Kluwer Academic Publishers, 1st Edition, 1999), and E. Gal and S. Toledo, *ACM Computing Surveys*, 37(2):138-163 (2005). Well-known applications of flash memories include cell phones, digital cameras, USB flash drives, computers, sensors, and many more. They are now also replacing magnetic disks as hard disks, such as the 64 GB hard disk by SanDisk (see "SanDisk launches 64 gigabyte solid state drives for notebook PCs, meeting needs for higher capacity," available at the Web site URL of http://biz.yahoo.com/cnw/070604/sandisk.html?.v=1). See also the Web article on the 256 GB hard disk by PQI ("PQI unveils 256 GB solid state drive," available at the URL of www.guru3d.com/newsitem.php?id=5392). Based on the popular floating-gate technology, the dominance of flash memories is likely to continue.

However, there exist critical problems limiting the improvement of flash memories with respect to their speed, reliability, longevity, and storage capacity. Flash memories have a limited lifetime due to the quality degradation caused by block erasures; a flash memory can endure only about $10^5 \sim 10^6$ block erasures before it becomes no longer usable (see S. Aritome et al., *Proceedings of the IEEE*, 81(5):776-788 (1993), and P. Cappelletti et al., ibid. Removing charge from any single cell for data modification requires the block to be erased and all the $10^5$ or so cells in it to be reprogrammed (or programmed to another block). The writing speed is constrained by a conservative cell-programming process that is about ten times slower than reading. The purpose of such conservative programming is to avoid over-programming, a serious error correctable only by block erasure and reprogramming. Data reliability is limited by errors caused by charge leakage, disturbs, and the like. See S. Aritome et al., ibid; P. Cappelletti et al., ibid; and P. Pavan et al., *Proceedings of The IEEE*, 85(8):1248-1271 (August 1997). The errors become more common when multi-level cells are used to increase the storage capacity.

New data storage modulation techniques that make more efficient use of the data storage cells in memory devices would be useful. Such new techniques should reduce the ill effects of over-programming of cells and increase the speed of data access.

From the discussion above, it should be apparent that there is a need for more efficient data storage techniques that reduce over-programming of cells in memory devices and increase the speed of data access. The present invention satisfies these needs.

SUMMARY

A new scheme, the rank modulation scheme, for storing data in flash memories is provided. It aims at eliminating the risk of cell over-programming, and reducing the effect of asymmetric errors. Given a set of n cells with distinct charge levels, the rank of a cell indicates the relative position of its own charge level, and the ranks of the n cells induces a permutation of $\{1, 2, \ldots, n\}$. The rank modulation scheme uses this permutation to store information. To write data into the n cells, we first program the cell with the lowest rank, then the cell with the second lowest rank, and finally the cell with the highest rank. While programming the cell with rank i ($1<i\leq n$), the only requirement is to make its charge level be above that of the cell with rank i−1.

Devices that operate in accordance with the rank modulation scheme encode a data value to be encoded into a codeword, wherein the codeword indicates n cell values that comprise a virtual cell in which relative rank ordering of the n cell values determines a permutation comprising one of n! permutations. Such devices encode by generating a permutation A corresponding to the codeword, wherein A is given by $A=[a_1, a_2, \ldots, a_n]$ integer values such that the $[a_1, a_2, \ldots, a_n]$ permutation conforms to a rank modulation scheme for data representation, and providing the permutation to a data destination over an information channel. Such encoding can be performed by determining coordinates that correspond to a codeword, wherein the coordinates specify a value that can correct erroneously read coordinates that differs from the correct coordinates by a distance r. Thus, encoding can be accomplished with a modulation code capable of correcting r errors in a received codeword.

The rank modulation scheme eliminates the need to use the actual values of cell levels to store information. Instead, the relative ranks of cell levels are used. Since there is no risk of over-programming and the cell charge levels can take continuous values, a substantially less conservative cell programming method can be used and the writing speed can be improved. In addition, asymmetric errors become less serious, because when cell levels drift in the same direction, their ranks are not affected as much as their absolute values. This way both the writing speed and the data reliability can be improved. The cell levels can be represented by, for example, charge levels in memory cells and signal features of a transmitted signal, wherein the signal features can comprise signal frequency, magnitude, or time duration. The cell values are modulated in accordance with the rank modulation scheme so that a group of cell values comprise a virtual cell in which relative rank ordering defines a permutation.

A data device receives a data value to be encoded into a codeword, wherein the codeword indicates n cell values that comprise a virtual cell in which relative rank ordering of the n cell values determines a permutation comprising one of n! permutations. The device generates a permutation A corresponding to the codeword, wherein A is given by A=[$a_1$, $a_2$, ..., $a_n$] integer values such that the [$a_1$, $a_2$, ..., $a_n$] permutation conforms to a rank modulation scheme for data representation in which the $a_i$ values are arranged in rank order. Having generated the permutation, the device then provides the permutation to a data destination over an information channel. The data destination may comprise memory cells, such as flash memory, or the data destination may comprise a transmitter, in the case where the cells comprise signal features. This technique for representing data comprises a new data scheme referred to as a rank modulation scheme. The rank modulation scheme drastically reduces the risk or over-programming and increases the speed of data access.

The new scheme, the rank modulation scheme, is especially suited for storing data in flash memories. It aims at eliminating the risk of cell over-programming, and reducing the effect of asymmetric errors. Given a set of n cells with distinct charge levels, the rank of a cell indicates the relative position of its own charge level, and the ranks of the n cells induce a permutation of $\{1, 2, ..., n\}$. The rank modulation scheme uses this permutation to store information. To write data into the n cells, we first program the cell with the lowest rank, then the cell with the second lowest rank, and finally the cell with the highest rank. While programming the cell with rank i ($1 < i \leq n$), the only requirement is to make its charge level be above that of the cell with rank i−1.

Other features and advantages of the present invention should be apparent from the following description of exemplary embodiments, which illustrate, by way of example, aspects of the invention.

BRIEF DESCRIPTION OF THE DRAWINGS

FIGS. 12A, 12B, and 12C are tree diagrams that illustrate cases for computing the opt function in accordance with the invention.

DETAILED DESCRIPTION

The contents of this Detailed Description are organized under the following major headings:
  I. Introduction to Rank Modulation
  II. Definitions and Basic Construction
  III. Balanced n-RMGCs
  IV. Rewriting with Rank Modulation Codes
  V. Optimizing Average Rewrite Cost
  VI. Joint Coding for Load Balancing
  VII. Operation and Embodiments
  VIII. Conclusion I. Introduction to Rank Modulation The rank modulation scheme organizes a set of memory cells into a "virtual cell" such that each virtual cell stores information in a permutation determined by the different charge levels of the individual cells in the set. That is, the relative rank of the charge levels in the cells of a single set determines a permutation ordering that represents a codeword. The resulting data storage scheme eliminates the need for determining discrete cell charge levels to determine codewords. Therefore, overshoot errors when programming cells (a serious problem that reduces the writing speed of conventional flash memories) are eliminated, and problems with asymmetric errors are mitigated.

In the rank modulation scheme, a set of n cells is grouped into a single virtual cell such that each of the n cells has a distinct charge level, and the relative charge level of a cell indicates its rank in the group. The set of n cells determines a permutation $\{1, 2, 3, ..., n\}$ that corresponds to a codeword. Thus, the permutation is used to store information. In a set of cells, the cell with the highest level has the highest (first) rank and is first in the permutation, the second-highest cell has the next rank, and so forth to define a permutation in order from highest level cell to lowest level cell, such as $\{3, 2, 1\ 4\}$. Thus, each permutation can correspond to a different codeword and thereby represent data.

Figure 1:
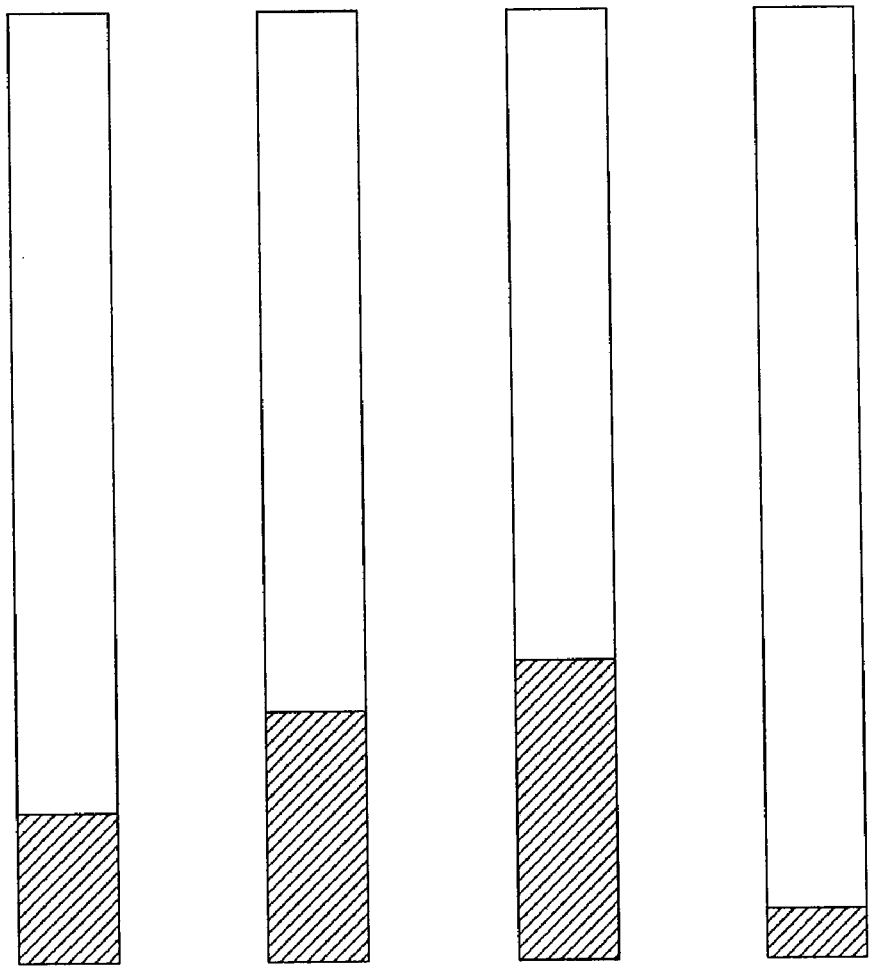
FIG. 1 is a schematic representation of a memory cell arrangement in accordance with the description herein.

FIG. 1 is a schematic representation of a memory cell arrangement in accordance with the rank modulation scheme wherein each rectangular box of FIG. 1 represents a conventional multilevel memory cell. FIG. 1 shows only four memory cells, for simplicity of illustration, but it should be understood that a typical data storage device, such as a flash memory device, will contain many more cells than illustrated in FIG. 1. The four memory cells in FIG. 1 are designated $A_1$, $A_2$, $A_3$, $A_4$ and represent a grouping of memory cells wherein the set of four cells determines a permutation given by A=[$A_1$, $A_2$, $A_3$, $A_4$] such that stored charge levels in the cells correspond to a codeword. For example, in FIG. 1, the cell $A_3$ has the highest charge level, as indicated by the cross-hatching within the $A_3$ box. The cell $A_2$ has the next highest charge level, followed by $A_1$ and then by $A_4$. Thus, FIG. 1 represents a permutation of [3, 2, 1, 4].

A. Current Technology

A flash memory consists of floating-gate cells as its basic storage elements. In most products, a cell has two states and therefore can store one bit, but to increase data density, multilevel storage (where a cell has 4 to 256 or even more states) is either already used or being developed. See P. Cappelletti et al., Chapter 6, "Multilevel Flash Memories", in *Flash Memories*, Kluwer Academic Publishers, 1st Edition, 1999. For a cell with q states, we denote them by 0, 1, ..., q−1. These states correspond to the threshold voltages of a cell, and are also called q levels. Different levels correspond to different data values. To increase (respectively, decrease) a cell's level, the flash memory uses the hot-electron injection mechanism or the Fowler-Nordheim tunneling mechanism to inject (respectively, remove) charge into (from) the cell. The charge can be electrons or holes, depending on if the cells are nFETs or pFETs. The more charge a cell has, the higher its threshold voltage is. A flash memory reads data by measuring the cells' threshold voltages. A cell with q discrete levels can store at most $\log_2 q$ bits. Note that actually, the level of a cell can be changed continuously. However, if the gap between adjacent levels is too small, errors will become common.

The cells in a flash memory are organized into blocks, where each blocks consists of 64K, 128K or 256K cells. See, for example, P. Cappelletti et al., Chapter 5, "Memory Architecture and Related Issues" in *Flash Memories*, Kluwer Academic Publishers, 1st Edition, 1999. To decrease a cell's level, the whole block has to be erased, which means lowering all the cells to the lowest level. This is called block erasure. Then the cells are reprogrammed sequentially. Block erasure is a necessary feature of flash memories for circuit compactness.

There are three major problems limiting the improvement of flash memories. (1) Block erasures. They significantly slow down the write speed, shorten the memory's lifetime, and waste energy. Each block erasures reduces the cells' quality. After about $10^5 \sim 10^6$ block erasures, the flash memory will break down. See, for example, S. Aritome et al., *Proceedings of the IEEE*, 81(5):776-788 (1993); P. Cappelletti et al., supra. Therefore, a better scheme for rewriting (i.e., modifying data) is desirable so that most rewrites will not cause block erasures. Unfortunately, most rewrites as currently performed will cause block erasures. (2) Over-programming. This occurs when a cell's level is raised above the target level, resulting in an error. When over-programming happens, the block must be erased and reprogrammed. To avoid over-programming, a very conservative write procedure is currently used; the cell level is raised little by little (and measured repeatedly) until it reaches the target level. See P. Cappelletti et al., supra; P. Pavan et al., *Proceedings of The IEEE*, 85(8): 1248-1271 (August 1997). This makes writing slow. (3) Load balancing. To lower just one cell's level, the block must be erased. So when some data are modified more frequently than others, the data modified most frequently cause most of the block erasures. It happens in many applications, such as programs, databases, and hard disks. See, for example, A. Birrell et al., "A Design for High Performance Flash Disks," *ACM Operating Systems Review*, 41(2), April 2007, pages 88-93. The cells should be used in a more balanced way regardless of how skewed the data modification frequencies are.

B. Basic Concepts and Motivations of Rank Modulation Coding

As noted above, rank modulation uses the order (i.e., ranks) of cell charge levels, instead of their absolute values. For example, if the charge levels of three cells are $v1=1.2$, $v2=1.5$, $v3=1.0$, then the order of cell levels is [2, 1, 3], meaning that the "2" cell has the highest level and the "3" cell has the lowest level. If their levels are $v1=1.25$, $v2=1.48$, $v3=1.1$, then the order is still [2, 1, 3] even though the actual cell levels have changed. Using cell rank order to represent data makes writing and rewriting much simpler, and the cell levels do not have to take discrete values. Instead, they can be continuous. In the above example, the full order of cell levels is used. As a more general (and powerful) scheme, we can use the partial order of cell levels to represent data.

A rank modulation coding scheme defines a mapping from the (partial) order of a set of cells' levels to data. It also defines a procedure for rewriting data. To change the cell levels from one order to another order, some cells' levels are raised, and they are raised with an important property: when a cell's level is being raised, the only requirement for its targeted level is that the targeted level is higher than some other cell's level. Because of this property, clearly over-programming will never happen in the rank modulation scheme. We will now illustrate rank modulation coding with an example.

C. Example of Rank Modulation Coding

Figures 2, 3:
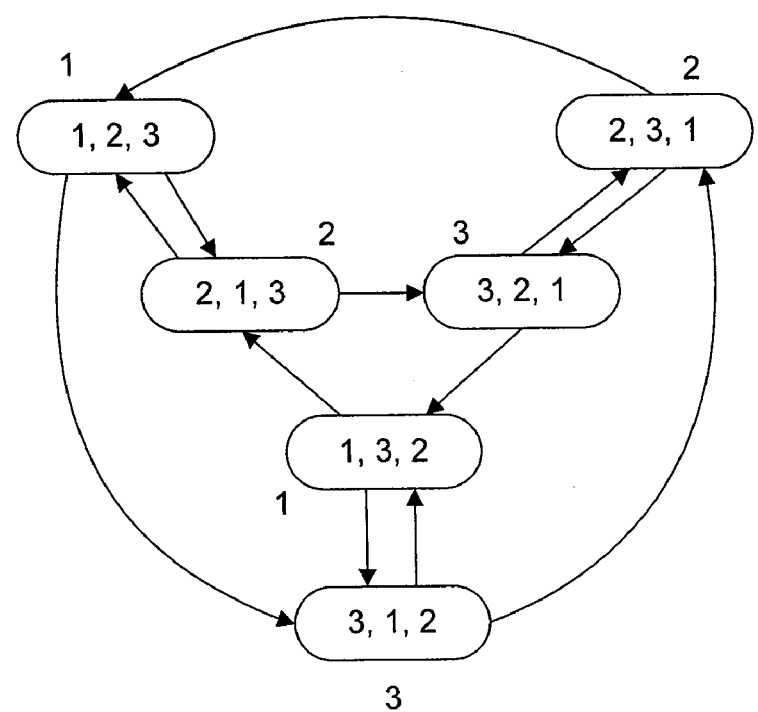
FIG. 2 shows a mapping of cell order to codewords for a rank modulation scheme that uses three cells to represent a ternary variable.
FIG. 3 is a transition diagram that shows a procedure for rewriting in the rank modulation scheme of FIG. 2.
Figures 4A, 4B, 4C:
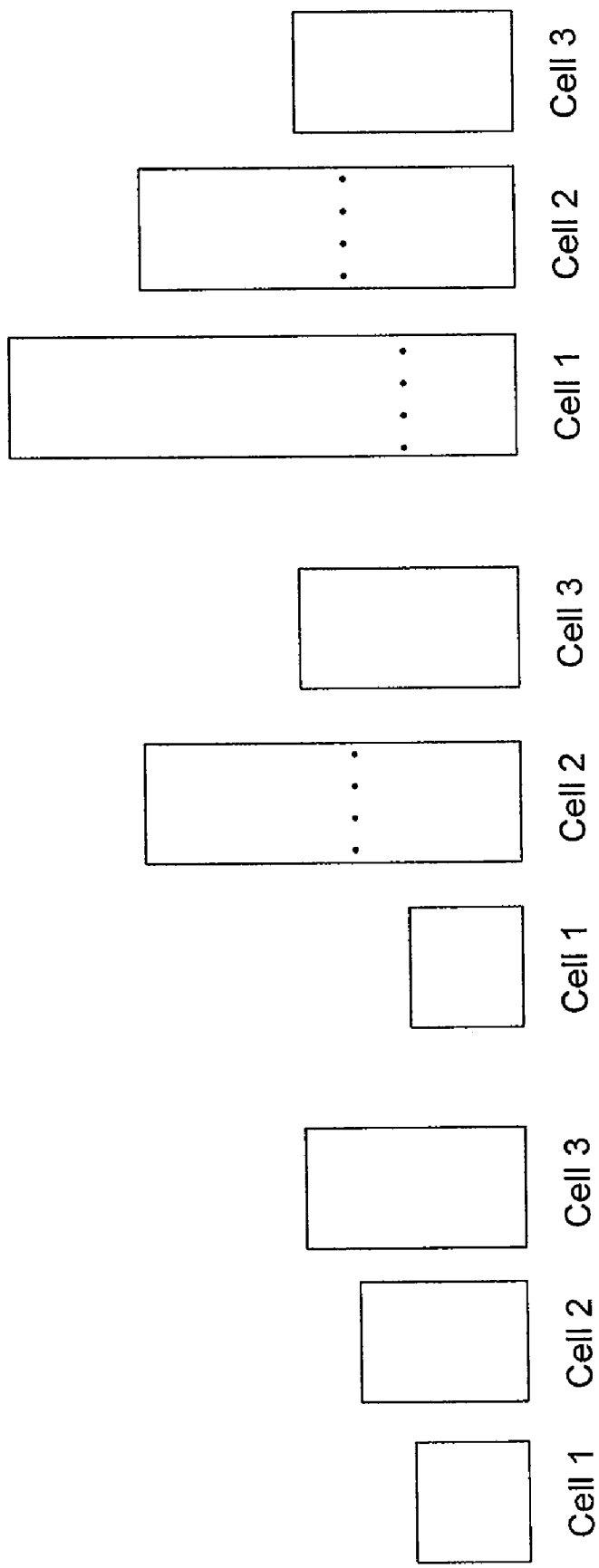
FIGS. 4A, 4B, and 4C represent rewriting in the rank modulation scheme of FIG. 2 according to the procedure of FIG. 3 to provide different codewords and corresponding data values.

Example 1: FIGS. 2, 3, and 4 illustrate a rank modulation coding scheme that uses three cells to represent a ternary variable. The mapping from the order of cell levels to the variable is shown in FIG. 2. The procedure for rewriting is illustrated in FIG. 3. It is actually relatively simple by examination of the drawings; in a grouping of cells, if a variable's value is changed from i to j, then the j-th cell's level is raised to be the highest level. That is, in the example, if the data to be stored is "1", then the level of the first cell is raised to be the highest level (pushed to the top); if the data to be stored is "2", then the level of the second cell is pushed to the top; if the data to be stored is "3", then the level of the third cell is pushed to the top. An example of rewriting is shown in FIGS. 4A, 4B, and 4C, where the represented variable changes as from 3→2→1, and the order of the cell levels changes as (3, 2, 1)→(2, 3, 1)→(1, 2, 3). FIG. 4A represents (3, 2, 1), with cell "3" having the highest charge; FIG. 4B represents (2, 3, 1); FIG. 4C represents (1, 2, 3). It should be noted that, for each change in ordering (and for each change in variable represented), only one cell is changed in value, so that it becomes the highest level (i.e., is pushed to the top). None of the other cell values are changed during a rewrite operation. The dotted lines represent the original charge levels of the respective cells from FIG. 4A.

It should be apparent that the data cannot be modified infinitely many times without any block erasure, because there is a finite maximum value for the cell level. The optimization objective of rank modulation coding is to achieve the optimal tradeoff between (1) storage capacity, and (2) the number of times data can be modified before the block erasure is needed. Rank modulation code features related to this objective are described further below and in the above-referenced co-pending U.S. patent application by Anxiao Jiang, et al. (see the U.S. patent application entitled "Error Correcting Codes for Rank Modulation" by A. Jiang et al. filed Nov. 20, 2008).

The rank modulation scheme is especially suited for multilevel cell constructions, such as multilevel flash memory devices. Error correction techniques for multilevel flash memory devices are quite well-known. Such techniques, however, are not very effective for the errors encountered with different modulation schemes, such as the rank modulation scheme. Errors in conventional flash memory devices involve correction of discrete charge level readings from cells. Errors in devices that use a rank modulation data scheme will not involve correction of discrete charge level, but will involve correction of transposition errors in the relative ranking of the cells within a set of cells.

Rank modulation coding provides a new way to program and store data. We can further improve this scheme by using the joint coding of data to improve load balance, and use error-correcting codes to improve data reliability. In addition, we can intentionally use controlled charge leakage to lower the cell levels uniformly without changing their ranks, thus reducing or even eliminating the need to erase blocks for rewriting data. The details on these topics will be further described below.

D. Rank Modulation and Rewriting

As described above, rank modulation coding for memory devices effectively removes the risk of over-programming. It can improve the cell-programming (write) speed, data reliability, and storage capacity. This section presents several focused research topics relating to rank modulation coding: cell-programming speed, storage capacity, and data modification capability.

1. Optimizing Cell-Programming Speed

In flash memories, programming cells (i.e., writing) is substantially slower than reading cells. For both NOR and NAND flash memories, the writing speed is about 1/10 of the reading speed. See, for example, P. Cappelletti et al., supra. Common read and write speeds are multiple MB per second. The slow writing speed is due to the iterative programming process; to avoid over-programming, which can only be corrected by block erasures, the flash memory repeatedly raises the cell's level by small amounts and measures it, until the cell level reaches the targeted value.

Figure 5A:
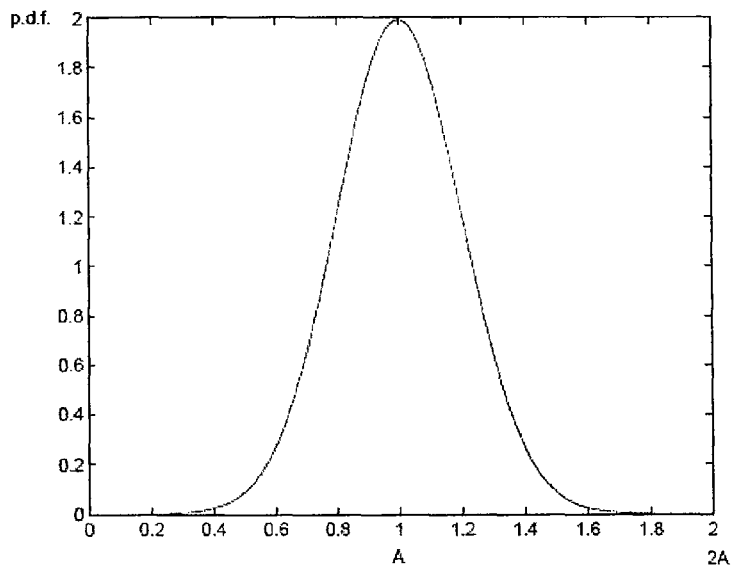
FIGS. 5A, 5B, 5C show probability density functions from simulations performed for memory devices utilizing rank modulation coding as described herein.
Figure 5B:
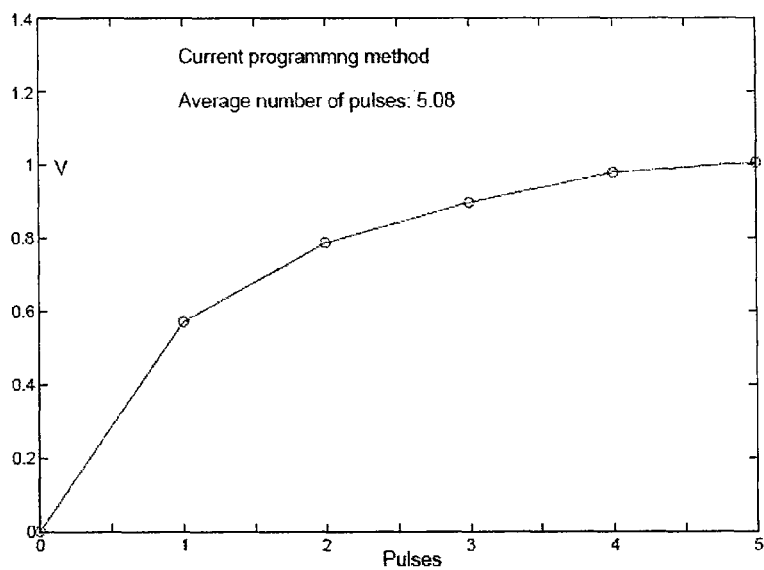
Figure 5C:
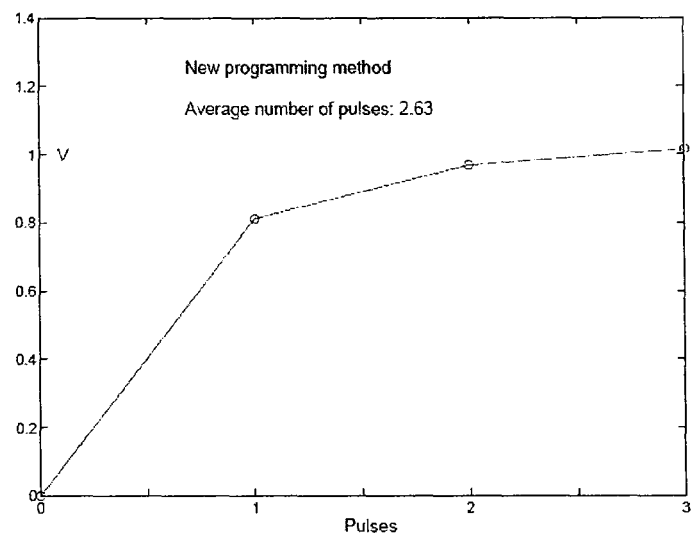

Rank modulation coding can significantly improve the cell programming speed because it removes the risk of over-programming. The following example shows the idea. Consider raising a cell's level from 0 to V. It requires multiple rounds of cell-level increase and measurement. Since flash cells usually have different characteristics, the actual increase is different from the targeted increase. To assist numerical computation, we model the cell-level increase by the truncated Gaussian distribution: when the targeted increase is A, the actual increase has the probability density function $$f(x) = \frac{1}{\sigma\sqrt{2\pi}} e^{-\frac{(x-A)^2}{2\sigma^2}} \cdot \frac{1}{p} \text{ for } 0 \le x \le 2A,$$

where p is a normalization factor. Let $\sigma=0.2$ A. See, for example, the probability density function illustrated in FIGS. 5A, 5B, and 5C, given by simulation results. Note that in FIG. 5A, the maximum increase is 2 A, twice the expected value, which is observable in flash memory experiments.

The current storage approach cannot tolerate over-programming. It requires the final cell level to be in a range, $[V(1-\alpha), V(1+\alpha)]$. Let $\alpha=2\%$. To avoid over-programming, given a current cell level $\upsilon$, the next-round targeted increase is at most $$\frac{V(1+\alpha) - \upsilon}{2}.$$

It can be shown that on average, 5.08 rounds of increase-measurement need be taken for programming a cell. FIG. 5B shows how the cell level approaches the final level.

Rank modulation coding removes the risk of over-programming. For fair comparison, the objective is that the final cell level should be at least $V(1-\alpha)$ and on average be V. Since there is no constraint on how large the cell level can be in the worst case, the expected increase in each round can be set larger. A numerical simulation shows that on average, 2.63 rounds of increase-measurement are needed for programming a cell. See FIG. 5C. This means that rank modulation coding can improve the cell-programming speed by 93%.

The above example shows the programming of a single cell. It should be apparent, in view of this description, that the same idea can be extended for parallel/joint programming of multiple cells.

2. Optimizing Storage Capacity

Rank modulation coding can help improve the storage capacity due to its tolerance of asymmetric errors. In flash memories, a major source of errors is charge leakage, which means that cells gradually lose charge, and their levels decrease consequently. Numerous disturb mechanisms—programming/read/erasure disturbs, and the like, also tend to make cell levels change in one direction. Rank modulation coding uses the ranks of cell levels to represent data, and such asymmetric errors affect the ranks less significantly than affecting their absolute values.

As a simplified model, consider asymmetric errors that change the levels of a group of cells in one direction (either increase or decrease) by at most $D_{max}$ and at least $D_{min}$. Define $\lambda=(D_{max}-D_{min})/D_{max}$ as the drift of the asymmetric errors. For the current storage method, which uses the absolute values of cell levels, the margin between cell levels need be at least $2D_{max}$ in order to avoid an error in the data. For rank modulation coding, the margin can be as small as $D_{max}-D_{min}=\lambda D_{max}$. When $\lambda$ is small, the reduction in gap is substantial. For example, if $\lambda=0.25$, there is a reduction ratio r of r=8.

Rank modulation coding provides a new paradigm for studying the fundamental tradeoff between the storage capacity, the writing speed, and the rewriting capability of flash memories. The storage capacity, can be optimized based on the speed, reliability, and circuit complexity of flash memories.

3. Optimizing Data Modification Capability

Rewriting data efficiently—in terms of both rewriting time and storage capacity—has a significant impact on the performance of flash memories. In current flash file systems, to modify data, all the data in the old block are rewritten into a new block. See, for example, ALEPH ONE, YAFFS: Yet another flash filing system, Cambridge, UK, 2002 (available at the Internet URL of http://www.alephl.co.uk/yaffs/index.html; R. Dan and J. Williams, *Technical Report* 80-SR-002-00-6L Rev. 1.30, M-Systems, 1997; F. Douglis et al., *Proc. 1st USENIX Symposium on Operating Systems Design and Implementation (OSDI)*, pp. 25-37, Monterey, Calif., 1994; J. M. Marshall and C. D. H. Manning, Flash file management system, U.S. Pat. No. 5,832,493 (1998); K. W. Parker, Portable electronic device having a log-structured file system in flash memory, U.S. Pat. No. 6,535,949 (2003); D. Woodhouse, JFFS: The journaling flash file system, Ottawa Linux Symposium, 2001 (available at the Internet URL of http://source.redhat.com/jffs2/jffs2.pdf). The old block will be reused via a garbage-collection mechanism later. See, for example, E. Gal AND S. Toledo, *ACM Computing Surveys*, 37(2):138-163 (2005). Such an approach generally has two shortcomings: (1) before the old block is reused, the storage capacity is under-used, because the old block is being wasted;

(2) even if only a small portion of the data are actually modified, still the whole block is rewritten, which makes the rewriting slow. That gives us motivations to study rewriting data locally in the same block until the cell levels reach the maximum level. The objective is to maximize the number of rewrites before a block erasure becomes necessary. When the same amount of storage space is used to store an l-ary variable, the coding schemes studied in this project can increase the number of rewrites by O(log l) times compared to current flash file systems. With joint coding, which will be presented in the next section, the performance gain can be even much bigger.

Thus far, a rank modulation code for rewriting has been described, where the full order of three cell levels is used to rewrite a ternary variable. See FIGS. 2, 3, 4 and accompanying description. For each rewrite, only one cell level needs to be increased. This code maximizes the number of allowed rewrites and is thus optimal. It can be generalized to variables of larger alphabets and more flash cells.

When n grows, using the partial order of cell levels will be better than using their full order to represent data. An example of rank modulation code based on partial order has been described, where two ternary variables are jointly stored. The code can be easily extended to store a single variable. The basic reason is that when partial orders are used, the gap between two cell levels that are not compared can be arbitrary (including being arbitrarily small).

The general research question is how to design rank modulation codes that optimize the rewriting capability, given any variable and any number of cells. Our results show that there exist codes of very strong rewriting capabilities. For example, let q denote the ratio of the maximum cell level and the margin between adjacent cell levels, and let n be the number of cells storing a variable. For a ternary variable, we have built a code that guarantees at least $$\left\lfloor \frac{q}{2} \right\rfloor (n-2)$$

rewrites. For a 4-ary variable, we have built a code that guarantees at least $$\left\lfloor \frac{q}{2} \right\rfloor [n - 7 - 2\log_2(n-1)] + 2$$

rewrites. We also have a code construction for any variable that guarantees $$\left\lfloor \frac{q}{2} \right\rfloor \cdot n + o(n)$$

rewrites as n increases.

4. Rewriting and Gray Codes

We therefore propose the rank-modulation scheme, whose aim is to eliminate both the problem of overshooting while programming cells, and the problem of memory endurance in aging devices. In this scheme, an ordered set of n cells stores the information in the permutation induced by the charge levels of the cells. In this way, no discrete levels are needed (i.e., no need for threshold levels) and only a basic charge-comparing operation (which is easy to implement) is required to read the permutation. If we further assume that the only programming operation allowed is raising the charge level of one of the cells above the current highest one (push-to-the-top), then the overshoot problem is no longer relevant. Additionally, the technology may allow in the near future the decrease of all the charge levels in a block of cells by a substantially uniform (constant) amount smaller than the lowest charge level (block deflation), which would maintain their relative values, and thus leave the information unchanged. This can eliminate a designated erase step, by deflating the entire block whenever the memory is not in use.

Once a new data representation is defined, several tools are required to make it useful. In this paper we present Gray codes that bring to bear the full representational power of rank modulation, and data rewriting schemes. The Gray code is an ordered list of distinct length n binary vectors such that every two adjacent words (in the list) differ by exactly one bit flip. See, for example, Gray, F. "Pulse Code Communication," U.S. Pat. No. 2,632,058 (March 1953). Since the time of the Gray patent, Gray codes have been generalized in countless ways and may now be defined as an ordered set of distinct states for which every state $s_i$ is followed by a state $s_{i+1}$ such that $s_{i+1}=t(s_i)$, where t∈T is a transition function from a predetermined set T defining the Gray code. In the original code, T is the set of all possible single bit flips. Usually, the set T consists of transitions that are minimal with respect to some cost function, thus creating a traversal of the state space that is minimal in total cost. For a comprehensive survey of combinatorial Gray codes, the reader is referred to Savage, C. D. *SIAM Rev.*, 39(4):605-629, (December 1997).

One application of the Gray codes is the realization of logic multi-level cells with rank modulation. The traversal of states by the Gray code is mapped to the increase of the cell level in a classic multi-level flash cell. In this way, rank modulation can be naturally combined with current multi-level storage solutions. Some of the Gray code constructions we describe also induce a simple algorithm for generating the list of permutations. Efficient generation of permutations has been the subject of much research as described in the general survey (Savage, C. D. *SIAM Rev.*, 39(4):605-629, (December 1997)), and the more specific (Sedgewick, R. *Computing Surveys*, 9(2):137-164, (June 1977)) (and references therein). In (Sedgewick, R. *Computing Surveys*, 9(2):137-164, (June 1977)), the transitions we use in this paper are called "nested cycling," and the algorithms cited there produce lists that are not Gray codes since some of the permutations repeat, which makes the algorithms inefficient.

We also investigate efficient rewriting schemes for rank modulation. Since it is costly to erase and reprogram cells, we try to maximize the number of times data can be rewritten between two erase operations (see, e.g., Bohossian, V. et al., *IEEE International Symposium on Information Theory (ISIT2007)*, Nice, France, pp. 1186-1190 (June 2007); Jiang, A., *Proceedings of the 2007 IEEE International Symposium on Information Theory (ISIT2007)*, Nice, France, pp. 1391-1395 (June 2007); Jiang, A. et al., *Proceedings of the 2007 IEEE International Symposium on Information Theory (ISIT2007)*, Nice, France, pp. 1166-1170 (June 2007)). For rank modulation, the key is to minimize the highest charge level of cells. We present two rewriting schemes that are, respectively, optimized for the worst-case and the average-case performance.

Rank modulation is a new storage scheme and differs from existing data storage techniques. There has been some recent work on coding for flash memories. Examples include floating codes (Jiang, A. Proceedings of the 2008 *IEEE International Symposium on Information Theory (ISIT2008)*, Toronto, Cariada, pp. 1741-1745 (July 2008); (Jiang, A. et al., *Proceedings of the 2007 IEEE International Symposium on*

Information Theory (ISIT2007), Nice, France, pp. 1166-1170 (June 2007)), which jointly record and rewrite multiple variables, and buffer codes (Bohossian, V. et al., IEEE International Symposium on Information Theory (ISIT2007), Nice, France, pp. 1186-1190 (June 2007); Yaakobi, E. et al., Proceedings of the 2008 IEEE International Symposium on Information Theory (ISIT2008), Toronto, Canada, poster (2008)) that keep a log of the recent modifications of data. Both floating codes and buffer codes use the flash cells in a conventional way, namely, the fixed discrete cell levels. Floating codes are an extension of the write-once memory (WOM) codes (see, e.g., Cohen, G. D. et al., IEEE Trans. on Inform. Theory, IT-32(5):697-700, (September 1986); Fiat, A. et al., IEEE Trans. on Inform. Theory, IT-30(3):470-480, (May 1984); Fu, F.-W. et al., "On the capacity of generalized write-once memory with state transitions described by an arbitrary directed acyclic graph," 45(1):308-313, (January 1999); Heegard, C. D. IEEE Trans. on Inform. Theory, IT-31(1):34-42, (January 1985); Rivest, R. L. et al., Inform. and Control, 55:1-19, (1982); Wolf, J. K. et al., AT&TBell Labs. Tech. J., 63(6):1089-1112, (1984)), which are codes for effective rewriting of a single variable stored in cells that have irreversible state transitions. The study in this area also includes defective memories (see Heegard, C. D. et al., IEEE Trans. on Inform. Theory, IT-29(5):731-739, (September 1983); Han Vinck, A. J. et al., IEEE Trans. on Inform. Theory, 40(6): 1866-1871, (1994)), where defects (such as "stuck-at faults") randomly happen to memory cells and how to store the maximum amount of information is considered. In all the above codes, unlike rank modulation, the states of different cells do not relate to each other. Also related is the work on permutation codes (see Berger, T. et al., IEEE Trans. on Inform. Theory, IT-18(1):160-169, (January 1972); Slepian, D. Proc. of the IEEE, 53(3):228-236 (1965)), used for data transmission or signal quantization.

The remainder of the paper is organized as follows: Section II describes a Gray code that is cyclic and complete (i.e., it spans the entire symmetric group of permutations); Section III introduces a Gray code that is cyclic, complete and balanced, optimizing the transition step and also making it suitable for block deflation; Section IV shows a rewriting scheme that is optimal for the worst-case rewrite cost; Section V presents a code optimized for the average rewrite cost with small approximation ratios; Section VI concludes this paper.

II. Definitions and Basic Construction

Let S be a state space, and let T be a set of transition functions, where every t∈T is a function t: S→S. A gray code comprises an ordered list $s_1, s_2, \ldots, s_m$ of m distinct elements from S such that for every $1 \leq i \leq m-1$, $s_{i+1} = t(s_i)$ for some t∈T. If $s_i = t(s_m)$ for some t∈T. then the code is cyclic. If the code spans the entire space S we call it complete.

Let [n] denote the set of integers $\{1, 2, \ldots, n\}$. An ordered set of n flash memory cells named 1, 2, . . . , n, each containing a distinct charge level, induces a permutation of [n] by writing the cell names in descending charge level $[a_1, a_2, \ldots, a_n]$, i.e., the cell $a_1$ has the highest charge level while $a_n$ has the lowest. The state space for the rank modulation scheme is therefore the set of all permutations over [n], denoted by $S_n$.

As described previously, the basic minimal-cost operation on a given state is a "push-to-the-top" operation by which a single cell has its charge level increased so as to be the highest of the set. Thus, for our basic construction, the set T of minimal-cost transitions between states consists of n−1 functions pushing the i-th element of the permutation, $2 \leq i \leq n$, to the front: $t_i([a_1, \ldots, a_{i-1}, a_i, a_{i+1}, \ldots, a_n]) = [a_i, a_1, \ldots, a_{i-1}, a_{i+1}, \ldots, a_n]$.

Throughout this work, our state space S will be the set of permutations over [n], and our set of transition functions will be the set T of "push-to-the-top" functions. We call such codes length-n Rank Modulation Gray Codes (n-RMGC).

Example 1. An Example of a 3-RMGC is given by the following Table 1:

TABLE 1

| 3 | 2 | 1 | 3 | 1 | 2 |
| 2 | 3 | 2 | 1 | 3 | 1 |
| 1 | 1 | 3 | 2 | 2 | 3 |

In Table 1, the permutations are the columns being read from left to right. The sequence of operations creating this cyclic code is: $t_2, t_3, t_3, t_2, t_3, t_3$. This sequence will create a Gray code regardless of the choice of the first column.

Figure 6:
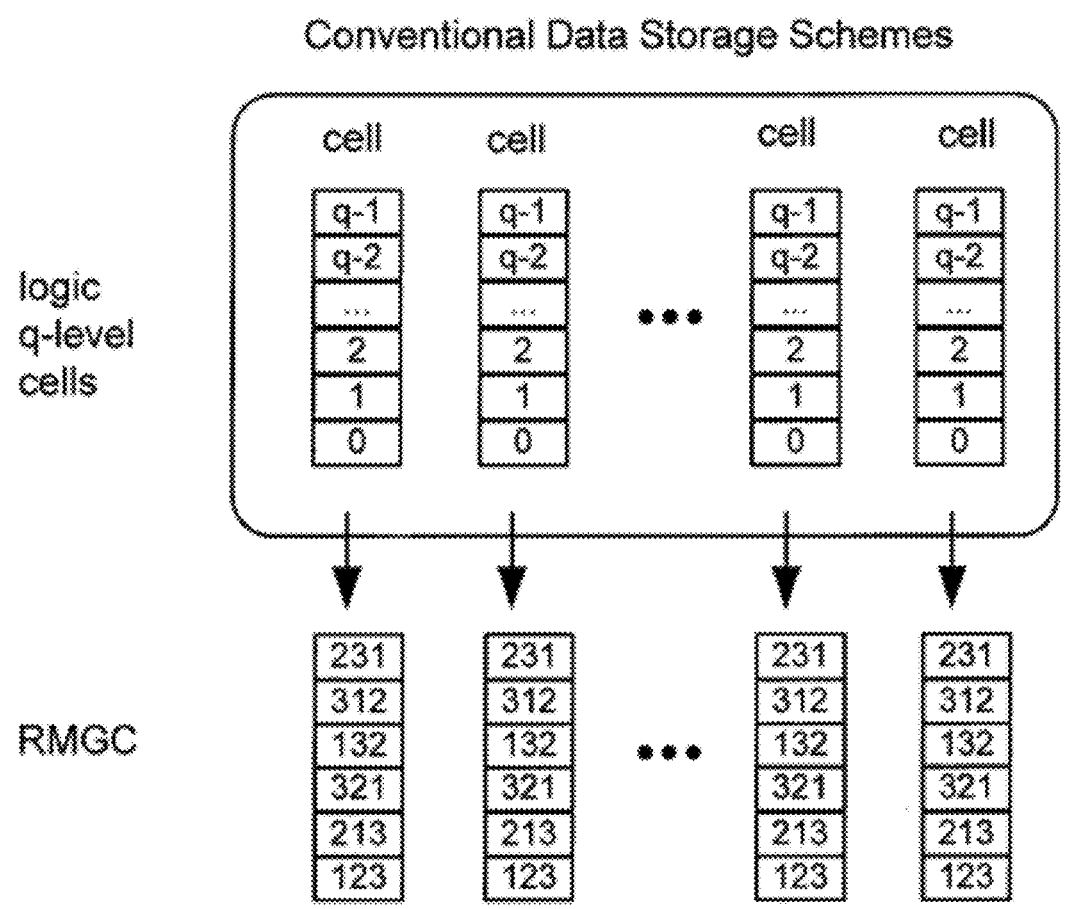
FIG. 6 is an illustration that shows an arrangement of cells using an RMGC code to realize logic q-level cells.

One important application of the Gray codes is the realization of logic multi-level cells. The traversal of states by the Gray code is mapped to the increase of the cell level in a classic multi-level flash cell. As an n-RMGC has n! states, it can simulate a cell of up to n! discrete levels. Current data storage schemes can therefore use the Gray codes as logic cells, as illustrated in FIG. 6, and get the benefits of rank modulation. See, for example, floating codes as described in Jiang, A. et al., Proceedings of the 2007 IEEE International Symposium on Information Theory (ISIT2007), Nice, France, pp. 1166-1170 (June 2007). FIG. 6 shows how RMGCs can be used to realize logic q-level cells, which are useful for conventional data storage schemes that store data such as floating codes. The upper portion of FIG. 6 shows a conventional data storage scheme to store logic q-level cells, whereas the lower portion of FIG. 6 shows a corresponding RMGC coding scheme that can store the same information.

We will now show a basic recursive construction for n-RMGCs. The resulting codes are cyclic and complete, in the sense that they span the entire state space. Our recursion basis is the simple 2-RMGC: [1, 2], [2, 1].

Now let us assume we have a cyclic and complete (n−1)-RMGC, which we call $C_{n-1}$, defined by the sequence of transitions $t_{i1}, t_{i2}, \ldots, t_{i(n-1)!}$ and where $t_{i(n-1)!} = t_2$, i.e., a "push-to-the-top" operation on the second element in the permutation. It should be noted that this last requirement merely restricts us to have $t_2$ used somewhere, since we can always rotate the set of transitions to make $t_2$ be the last one used. We further assume that the transition $t_2$ appears at least twice. We will now show how to construct $C_n$, a cyclic and complete n-RMGC with the same property.

We set the first permutation of the code to be [1, 2, . . . , n], and then use the transitions $t_{i1}, t_{i2}, \ldots, t_{i(n-1)!-1}$ to get a list of (n−1)! permutations we call the first block of the construction. By our assumption, the permutations in this list are all distinct, and they all share the property that their last element is n (since all the transitions use just the first n−1 elements). Furthermore, since $t_{i(n-1)!} = t_2$, we know that the last permutation generated so far is [2, 1, 3, . . . , n−1, n].

We now use $t_n$ to create the first permutation of the second block of the construction, and then use $t_{i1}, t_{i2}, \ldots, t_{i(n-1)!-1}$ again to create the entire second block. We repeat this process n−1 times, i.e., use the sequence of transitions $t_{i1}, t_{i2}, \ldots, t_{i(n-1)!-1}, t_n$ a total of n−1 times to construct n−1 blocks, each containing (n−1)! permutations.

The following two simple lemmas extend the intuition given above:

Lemma 2. The second element in the first permutation in every block is "2". The first element in the last permutation in every block is also "2".

Proof: During the construction process, in each block we use the transitions $t_{i1}, t_{i2}, \ldots, t_{i(n-1)!-1}$ in order. If we were to use the transition $t_{i(n-1)!}=t_2$ next, we would return to the first permutation of the block since $t_{i1}, t_{i2}, \ldots, t_{i(n-1)!}$ are the transitions of a cyclic (n−1)-RMGC. Since the element "2" is second in the initial permutation of the block, it follows that it is the first element in the last permutation of the block. By the construction, we now use $t_n$, thus making the element "2" second in the first permutation of the second block. By repeating the above arguments for each block we prove the lemma.

Lemma 3. In any block, the last element of all the permutations is constant. The sequence of last elements in the blocks constructed is (n, n−1, ..., 3, 1). The element "2" is never a last element.

Proof: The first claim is easily proved by noting that the transitions creating a block, $t_{i1}, t_{i2}, \ldots, t_{i(n-1)!-1}$, only operate on the first n−1 positions of the permutations. Also, by the same logic used in the proof of the previous lemma, if the first permutation of a block is $[a_1, a_2, a_3, \ldots a_{n-1}, a_n]$, then the last permutation in a block is $[a_2, a_1, a_3, \ldots, a_{n-1}, a_n]$, and thus the first permutation of the next block is $[a_1, a_2, a_1, a_3, \ldots, a_{n-1}]$.

It follows that if we examine the sequence containing just the first permutation in each block, the element $a_2$ remains fixed, and the rest just rotate by one position each time. By the previous lemma, the fixed element is "2", and therefore, the sequence of last elements is as claimed.

Figure 7:
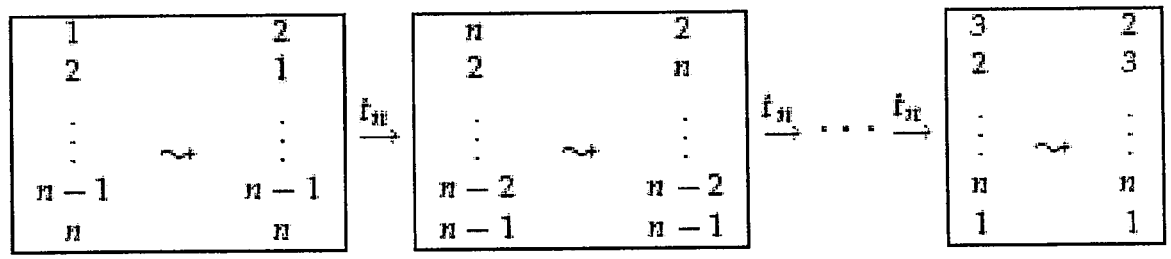
FIG. 7 is a schematic diagram of a cyclic but not complete n-RMGC arrangement for a flash memory device.

Combining the two lemmas above, the n−1 blocks constructed so far form a cyclic (but not complete) n-RMGC, that we call C', which is schematically depicted in FIG. 7. In FIG. 7, each box represents a single block, and the curved arrow ( ↷ ) denotes the sequence of transitions $(t_{i1}, \ldots, t_{i(n-1)!-1})$.

It should be apparent that C' is not complete because it is missing exactly the (n−1)! permutations containing "2" as their last element. We build a block C" containing these permutations in the following way: we start by rotating the list of transitions $(t_{i1}, \ldots, t_{i(n-1)!})$ such that its last transition is $t_{n-1}$. The transition $t_{n-1}$ must be present somewhere in the sequence or else the last element would remain constant, thus contradicting the assumption that the sequence generates a cyclic and complete (n−1)-RMGC. For convenience we denote the rotated sequence by $(\tau_{i1}, \ldots, \tau_{i(n-1)!})$, where $\tau_{i(n-1)!}=t_{n-1}$. Assume the first permutation in the block is $[a_1, a_2, \ldots, a_{n-1}, 2]$. We set the following permutations of the block C" to be the ones formed by the sequence of transitions $(\tau_{i1}, \ldots, \tau_{(n-1)!-1})$. Thus, the last permutation in C" is $[a_2, \ldots, a_{n-1}, a_1, 2]$.

In C' we look for a transition of the following form: $[a_2, \ldots, a_{n-1}, 2, a_1] \to [2, a_2, \ldots, a_{n-1}, a_1]$. We contend that such a transition must surely exist: C' does not contain permutations in which "2" is last, while it does contain permutations in which "2" is next to last, and some where "2" is the first element. Since C' is cyclic, there must be at least one transition $t_{n-1}$ pushing an element "2" from a next-to-last position to the first position. At this transition we split C' and insert C" as depicted in FIG. 8.

Figure 8:
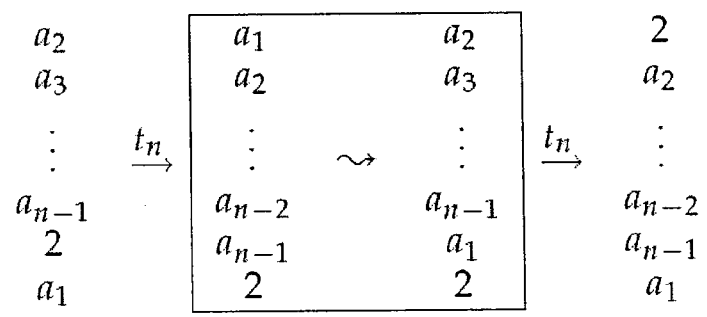
FIG. 8 is a schematic diagram of a cyclic and complete n-RMGC arrangement for a flash memory device.

In FIG. 8, it should be apparent to see that all transitions are valid. Thus we have created $C_n$ and to complete the recursion we have to make sure $t_2$ appears at least twice, but that requirement should be readily apparent, since the sequence $(t_{i1}, \ldots, t_{i(n-1)!-1})$ contains at least one occurrence of $t_2$, and is replicated n−1 times, n≧3. We therefore reach the following conclusion:

Theorem 4. For every integer n≧2 there exists a cyclic and complete n-RMGC.

The 3-RMGC shown in Example 1 is the result of this construction for n=3.

III. Balanced n-RMGCs

A. Definition and Construction

In the current models of flash memory, it is sometimes the case that due to precision constraints in the charge placement mechanism, the actual possible charge levels are discrete. The rank-modulation scheme is not governed by such constraints, since it only needs to order cell levels unambiguously by means of comparisons, rather than compare the cell levels against predefined threshold values. However, in order to describe the following results, we will assume abstract discrete levels, that can be understood as counting the number of push-to-the-top operations executed up to the current state. In other words, each push-to-the-top increases the maximum charge level by one.

Thus, we define the function $c_i: \mathbb{N} \to \mathbb{N}$, where $c_i(p)$ is the charge level of the i-th cell after the p-th programming cycle. It follows that if we use transition $t_j$ in the p-th programming cycle and the i-th cell is, at the time, j-th from the top, then $c_i(p) > \max_k \{c_k(p-1)\}$, and for $k \neq i$, $c_k(p)=c_k(p-1)$. In an optimal setting with no overshoots, $c_i(p)=\max_k \{c_k(p-1)\}+1$.

The jump in the p-th round is defined as $c_i(p)-c_i(p-1)$, assuming the i-th cell was the affected one. It is desirable, when programming cells, to make the jumps as small as possible. We define the jump cost of an n-RMGC as the maximum jump during the transitions dictated by the code.

Lemma 5. For any optimal n-RMGC, n≧3, the lowest jump cost is at least n+1.

Proof: In an optimal n-RMGC, n≧3, we must raise the lowest cell to the top charge level at least n times. Such a jump must be at least of magnitude n. We cannot, however, do these n jumps consecutively, or else we return to the first permutation after just n steps. It follows that there must be at least one other transition $t_i$, i≠n, and so the first $t_n$ to be used after it jumps by at least a magnitude of n+1.

We call an n-RMGC with a jump cost of n+1 a balanced n-RMGC. We now show a construction that turns any (n−1)-RMGC (balanced or not) into a balanced n-RMGC, while retaining properties such as being cyclic or complete. The intuitive idea is to base the construction on cyclic shifts $t_n$ that push the bottom to the top, and use them as often as possible. This is desirable because $t_n$ does not introduce gaps between the charge levels, so it does not aggravate the jump cost of the cycle. Moreover, $t_n$ partitions the set of permutations into (n−1)! orbits of length n. Theorem 6 gives a construction where these orbits are traversed consecutively, based on the order given by the supporting (n−1)-RMGC.

Theorem 6. Given a cyclic and complete (n−1)-RMGC, $C_{n-1}$, defined by the transitions $t_{i_1}, \ldots, t_{i_{(n-1)!}}$, then the following transitions define an n-RMGC, denoted by $C_n$, that is cyclic, complete and balanced:

$$t_{j_k} = \begin{cases} t_{n-i_{\lceil k/n \rceil}+1}, & k \equiv 1 \pmod{n} \\ t_n, & \text{otherwise} \end{cases}$$

for all $k \in \{1, \ldots, n!\}$.

Proof: Let us define the abstract transition $\vec{t}_i$, $2 \leq i \leq n$, that pushes to the bottom the i-th element from the bottom: $\vec{t}_i ([a_1, \ldots, a_{n-i}, a_{n-i+1}, a_{n-i+2}, \ldots, a_n])=[a_1, \ldots, a_{n-i}, a_{n-i+2}, \ldots, a_n, a_{n-i+1}]$.

Because $C_{n-1}$ is cyclic and complete, using $\vec{t}_{i_1}, \vec{t}_{i_{(n-1)!}}$ starting with a permutation of [n−1] produces a complete cycle through all the permutations of [n−1], and using them starting with a permutation of [n] creates a cycle through all the (n−1)!

permutations of [n] with the respective first element fixed, because they operate only on the last n−1 elements.

Because of the first element being fixed, those (n−1)! permutations of [n] produced by $\vec{t}_{i_1}, \ldots, \vec{t}_{i_{(n-1)!}}$, also have the property of being cyclically distinct. Thus, they are representatives of the (n−1)! distinct orbits of the permutations of [n] under the operation $t_n$, since $t_n$ represents a simple cyclic shift when operated on a permutation of [n].

Taking a permutation of [n], then using the transition $t_{n-i+1}$ once, $2 \leq i \leq n-1$, followed by n−1 times using $t_n$, is equivalent to using $t_i$:

$$\vec{t}_i(\sigma) = \left(\underbrace{t_n \cdot \ldots \cdot t_n}_{n-1 \text{ times}} \cdot t_{n-i+1}\right)(\sigma), \forall \sigma \in S_n.$$

Every transition of the form $t_{n-i+1}$, i≠n, moves us to a different orbit of $t_n$, while the n−1 consecutive executions of $t_n$ generate all the elements of the orbit. It follows that the resulting permutations are distinct. Schematically, the construction of $C_n$ based on $C_{n-1}$ is:

$$\underbrace{t_{n-i_1+1}, \overbrace{t_n, \ldots, t_n}^{n-1 \text{ times}}}_{\vec{t}_{i_1}}, \ldots, \underbrace{t_{n-i_{(n-1)!}+1}, \overbrace{t_n, \ldots, t_n}^{n-1 \text{ times}}}_{\vec{t}_{i_{(n-1)!}}}$$

The code $C_n$ is balanced, because in every block of n transitions starting with a $t_{n-i+1}$, $2 \leq i \leq n-1$, we have: the transition $t_{n-i+1}$ has a jump of n−i+1; the following i−1 transitions $t_n$ have a jump of n+1, and the rest a jump of n. In addition, because $C_{n-1}$ is cyclic and complete, it follows that $C_n$ is also cyclic and complete.

Theorem 7. For any n≥2, there exists a cyclic, complete and balanced n-RMGC.

Proof. We can use Theorem 6 to recursively construct all the supporting n'-RMGCs, n'∈{n−1, . . . , 2}, with the basis of the recursion being the complete cyclic 2-RMGC: [1, 2], [2, 1].

Figure 9:
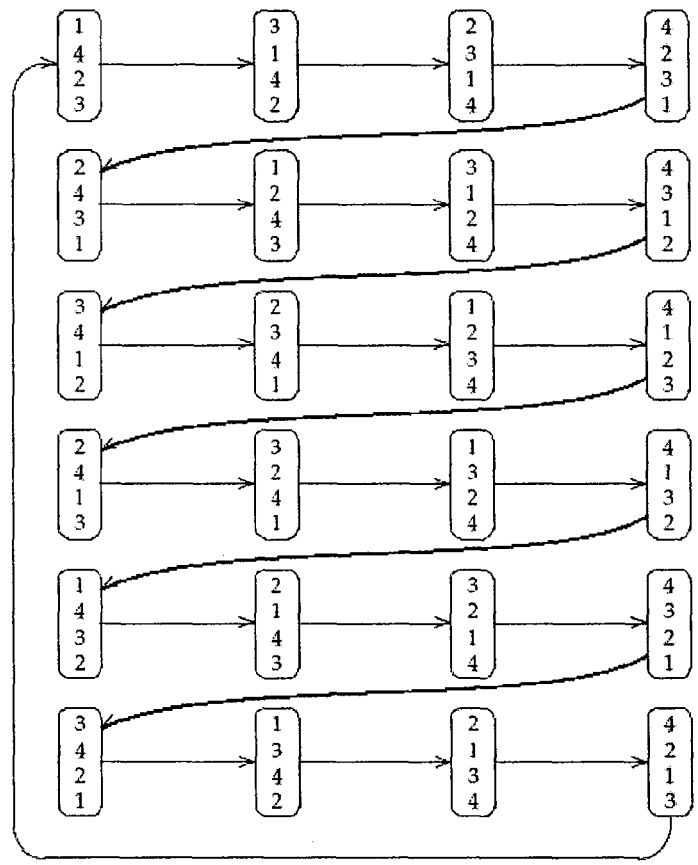
FIG. 9 is a schematic diagram that shows the transitions of a recursive, balanced n-RMGC for n=4.
Figure 10:
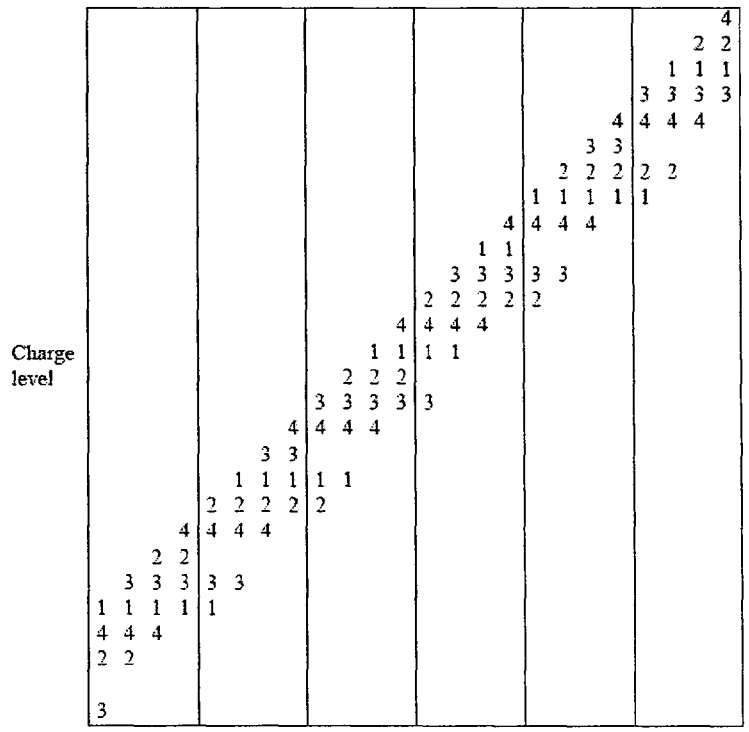
FIG. 10 is a schematic diagram that shows the charge levels of cells for each programming cycle in a recursive balanced 4-RMGC.

Example 8. FIG. 9 shows the transitions of a recursive, balanced n-RMGC for n=4. The permutations are represented in an n×(n−1)! matrix, where each row is an orbit generated by $t_n$. The transitions between rows occur when n=4 is the top element. These transitions are defined recursively by a balanced 3-RMGC over the set {1, 2, 3}, which is identical to the one from Example 1. Notice that the supporting 3-RMGC is reflected (e.g., written upside down) in the permutations of [4] that are exit points from the orbits.

B. Successor Function

The balanced n-RMGC can be used to implement a logic cell with n! levels. This can also be understood as a counter that increments its value by one unit at a time. The function Successor (n, [$a_1, \ldots, a_n$]) is depicted below in pseudocode to describe the sequence of operations performed in a memory device constructed in accordance with this description.

---

Function Successor (n, [$a_1, \ldots, a_n$])

input : n ∈ N, n ≥ 2; permutation [$a_1, \ldots, a_n$])
output : i ∈ {2, . . . , n} that determines the transition $t_i$ to the next permutation in the balanced recursive n-RMGC 1  if n = 2 then
2  |   return 2
3  else
4  |   if $a_1$ ≠ n then
5  |   |   return n
6  |   else
7  |   |   return n - Successor (n - 1, [$a_n, a_{n-1}, \ldots, a_2$]) + 1

---

The Successor function takes as input the current permutation, and determines the transition $t_i$ to the next permutation in the balanced recursive n-RMGC. If n=2, the next transition is always $t_2$ (line 2 of the function description). Otherwise, if the top element is not n, then the current permutation is not at the exit point of its orbit, therefore the next transition is $t_n$ (line 5). However, if n is the top element, then the transition is defined by the supporting cycle. The function is called recursively, on the reflected permutation of [$a_2, \ldots, a_n$] (line 7).

An important practical aspect is the average number of steps required to decide which transition generates the next permutation from the current one. A step is defined as a single query of the form "what is the i-th highest charged cell?", namely the comparison in line 4.

The Successor function is asymptotically optimal with respect to this measure:

Theorem 10. In the Successor function, the asymptotic average number of steps to create the successor of a given permutation is 1.

Proof: A fraction of $$\frac{n-1}{n}$$

the transitions are $t_n$, and these occur whenever the cell n is not the highest charged one, and they are determined in just one step. Of the cases where n is highest charged, by recursion, a fraction $$\frac{n-2}{n-1}$$

of the transitions are determined by just one more step, and so on. At the basis of the recursion, permutations over two elements require zero steps. Equivalently, the query "is $a_1$ equal to n" is performed for every permutation, therefore n! times; the query "is $a_n$ equal to n−1" is performed only for $$\frac{1}{n}n!$$

permutations, therefore (n−1)! times, and so on. Thus, the total number of queries is in $\Sigma_{i=3}^n i!$. Since $\lim_{n\to\infty} \Sigma_{i=3}^n i!/n! = 1$, the asymptotic average number of steps to generate the next permutation is as stated.

C. Ranking Permutations

In order to complete the design of the logic cell, we need to define the correspondence between a permutation and its rank in the balanced n-RMGC. This problem is similar to that of ranking permutations in lexicographic order. We will first review the factoradic number system, and then present a new numbering system that we call b-factoradic, induced by the balanced n-RMGC construction.

1) Review of the Factoradic Numbering System: The factoradic is a mixed radix number system. The earliest reference appears in Laisant, C. A. *Bulletin de la Soci'et'e Math'ematique de France*, 16:176-183, (1888). See also Lehmer, D. H. *Proc. Sympos. Appl. Math. Combinatorial Analysis*, 10:179-193 (1960), which describes algorithms that make the correspondence between permutations and factoradic.

Any integer number $m \in \{0, 1, \ldots, n!-1\}$ can be represented in the factoradic system by the digits $d_{n-1}d_{n-2}\ldots d_1 d_0$, where $d_i \in \{0, \ldots, i\}$ for $i \in \{0, \ldots, n-1\}$, and the weight of $d_i$ is $i!$ (with the convention that $0!=1$). The digit $d_0$ is always 0, and is sometimes omitted:

$$m = \sum_{i=0}^{n-1} d_i i!.$$

Any permutation $[a_1, \ldots, a_n]$ has a unique factoradic representation that gives its position in the lexicographic ordering. The digits $d_i$ are in this case the number of elements smaller than $a_{n-i}$ that are to the right of $a_{n-i}$. They are therefore inversion counts, and the factoradic representation is an inversion table (or vector). See, for example, Hall, M. Jr. et al., *Amer. Math. Monthly*, 72(2):21-28, (1965).

There is a large literature devoted to the study of ranking permutations from a complexity perspective. Translating between factoradic and decimal representation can be done in O(n) arithmetic operations. The bottleneck is how to translate efficiently between permutations and factoradic. A naive approach similar to the simple algorithms described in Lehmer, D. H. *Proc. Sympos. Appl. Math. Combinatorial Analysis*, 10:179-193 (1960) requires $O(n^2)$. This can be improved to O(n log n) by using merge-sort counting, or a binary search tree, or modular arithmetic. These techniques are described in Knuth, D. E., *The art of computer programming Volume 3: sorting and searching*, Addison Wesley, Reading, Mass., 2nd ed., (1998), Section 5.2.4 at pp. 158-168, Section 6.2.2 at pp. 426-448. This can be further improved to O(n log n/log log n) by using the special data structure of Dietz, described in Dietz, P., *Optimal algorithms for list indexing and subset rank*, Springer-Verlag London, UK, (1989). See, for example, Myrvold, W. et al., *Information Processing Letters*, 79(6): 281-284, (2001)), in which linear time complexity is also achieved by departing from lexicographic ordering. A linear time complexity is finally achieved in Mares M. et al., *Algorithms-ESA*, pp. 187-193, (2007), by using the fact that the word size has to be O(n log n) in order to represent numbers up to n!, and by hiding rich data structures in integers of this size.

2) B-Factoradic—A New Numbering System. We will now describe how to index permutations of the balanced recursive n-RMGC with numbers from $\{0, \ldots, n!-1\}$, such that consecutive permutations in the cycle have consecutive ranks modulo n!. The permutation that gets index 0 is a special permutation that starts a new orbit generated by $t_n$, and also starts new orbit in any of the recursive supporting n'-RMGCs, $n' \in \{n-1, \ldots, 2\}$.

The rank of a permutation is determined by its position in the orbit of $t_n$, and by the rank of the orbit, as given by the rank of the supporting permutation of [n-1]. The position of a permutation inside an orbit of $t_n$ is given by the position of n. If the current permutation is $[a_1, \ldots, a_n]$ and $a_i = n$ for $i \in \{1, \ldots, n\}$, then the position in the current orbit of $t_n$ is $(i-2)$ mod n (because the orbit starts with n in position $a_2$). The index of the current orbit is given by the rank of the supporting permutation of [n-1], namely the rank of $[a_{i-1}, a_{i-2} \ldots a_1, a_n, a_{n-1}, \ldots, a_{i+1}]$ (notice that the permutation of [n-1] is reflected). Therefore, if $a_i = n$, then:

$$\text{Rank}([a_1, \ldots, a_n]) = ((i-2) \bmod n) + n \cdot \text{Rank}([a_{i-1}, \ldots, a_1, a_n, \ldots, a_{i+1}]) \quad \text{Equation (1)}$$

The above formula can be used recursively to determine the rank of the permutations from the supporting balanced n'-RMGCs, for $n' \in \{n-1, \ldots, 2\}$. It now should become clear what permutation should take rank 0. The highest element in every supporting RMGC should be in the second position, therefore $a_2 = n$, $a_n = n-1$, $a_3 = n-2$, $a_{n-1} = n-3$ and so on, and $a_1 = 1$. Therefore, $[1, n, n-2, n-4, \ldots, n-3, n-1]$ gets the rank 0.

Equation (1) induces a new numbering system that we call b-factoradic (backwards factoradic). A number $m \in \{0, \ldots, n!-1\}$ can be represented by the digits $b_{n-1}b_{n-2}\ldots b_1 b_0$, where $b_i \in \{0, \ldots, n-1-i\}$ and the weight of $b_i$ is $n!/(n-i)!$. In this case $b_{n-1}$ is always 0 and can be omitted. It is easy to verify that this is a valid numbering system, therefore any $m \in \{0, \ldots, n!-1\}$ has a unique b-factoradic representation such that:

$$m = \sum_{i=0}^{n-1} b_i \frac{n!}{(n-i)!}.$$

The weights of the b-factoradic are sometimes called "falling factorials", and can be represented succinctly by the Pochhammer symbol.

Example 11. Let n=6 and $\sigma$=[2, 5, 4, 3, 6, 1] be the current permutation. We can find its b-factoradic representation $b_5 b_4 b_3 b_2 b_1 b_0$ as follows. We start from the least significant digit $b_0$, which is given by the position of (6 minus 2) modulo 6, so $b_0 = (5-2) \bmod 6 = 3$ (here we keep the elements of the permutation indexed from 1 to n). We now perform recursion on the residual permutation of 5 elements, $\sigma_5 = [3, 4, 5, 2, 1]$ (notice the reflected reading of this permutation, from 6 towards the left). Now $b_1$ is given by the position of 5; $b_1 = (3-2) \bmod 5 = 1$. The residual permutation is $\sigma_4 = [4, 3, 1, 2]$, therefore $b_2 = (1-2) \bmod 4 = 3$. For the next step $\sigma_3 = [2, 1, 3]$ and $b_3 = (3-2) \bmod 3 = 1$. Finally, $\sigma_2 = [1, 2]$ and $b_4 = (2-2) \bmod 2 = 0$. As always $b_{n-1} = b_5 = 0$. The b-factoradic representation is therefore $0_5 0_4 1_3 3_2 1_1 3_0$, where the subscript indicates the position of the digit. Going from a b-factoradic representation to a permutation of the balanced n-RMGC can follow a similar reversed procedure.

The procedure of Example 11 can be formalized algorithmically, however its time complexity is $O(n^2)$, similar to the naive algorithms specific to translations between permutations in lexicographic order and factoradic. We can in principle use all the available results for factoradic, described previously, to achieve time complexity of O(n log n) or lower. However, we are not going to repeat all those methods here, but rather describe a linear time procedure that takes a permutation and its factoradic as input and outputs the b-factoradic. We can thus leverage directly all the results available for factoradic, and use them to determine the current symbol of a logic cell.

The procedure "Factoradic-to-BFactoradic" listed below in pseudocode exploits the fact that the inversion counts are already given by the factoradic representation, and they can be used to compute directly the digits of the b-factoradic. A b-factoradic digit $b_k$ is a count of the elements smaller than n-k that lie between n-k+1 and n-k when the permutation is viewed as a cycle. The direction of the count alternates for even and odd values of k. The inverse of the input permutation v can be computed in O(n) time (line 1 of the pseudocode). The position of every element of the permutation can then be computed in constant time (lines 2 and 5). The test in line 6 decides if we count towards the right or left starting from the position i that holds element n−k+1, until we reach position j that holds element n−k. By working out the cases when i<j and j<i we obtain the formulas in lines 7 and 9. Since this computation takes a constant number of arithmetic operations, the entire algorithm takes O(n) time.

---

Procedure Factoradic-To-BFactoradic

```
input  : n ∈ N, n ≥ 2; permutation σ = [a₁, . . . , aₙ] and its
         factoradic d_{n-1} . . . d₁d₀.
output : b-factordic b_{n-1} . . . b₁b₀ corresponding to the index of
         σ in the balanced recursive n-RMGC starting with
         [1, n, n - 2, . . . , n - 3, n - 1].
1  compute the inverse permutation σ⁻¹
2  i ← σ⁻¹(n)                              // namely a_i = n
3  b₀ ← (n - d_{n-i} - 2) mod n
4  for k ← 1 to n - 2 do
5  |   j ← σ⁻¹(n - k)                      // namely a_j = n - k
6  |   if k is even then
7  |   |   b_k ← (d_{n-i} - d_{n-j} - 2) mod (n - k)
8  |   else
9  |   |   b_k ← (d_{n-j} - d_{n-i} - 1) mod (n - k)
10 |   i ← j
11 b_{n-1} ← o
```

---

For Unranking, namely going from a number in $\{0, \ldots, n!-1\}$ to a permutation in balanced order, the logic cell is designed to be a counter. For completeness, we describe the simplest $O(n^2)$ procedure Unrank, given by the pseudocode listing below. The procedure Unrank takes a b-factoradic as input and produces the corresponding permutation. The procedure uses variable p to simulate the cyclic counting of elements smaller than the current one. The direction of the counting alternates, based on the test in line 4 of the pseudocode.

---

Procedure Unrank

```
input  : n ∈ N, n ≥ 2; b-factoradic b_{n-1}, . . . , b₀
output : Permutation [a₁, . . . , aₙ]
1  Initialize [a₁, . . . , aₙ] ← [1, . . . , 1]
2  p ← 0
3  for i ← n down to 2 do
4  |   if i ≡ n mod 1 then
5  |   |   for j ← 1 to b_{n-i} + 2 do
6  |   |   |   p ← (p + 1) mod n
7  |   |   |   while a_p ≠ 1 do
8  |   |   |   |   p ← (p + 1) mod n
9  |   else
10 |   |   for j ← 1 to b_{n-i} + 2 do
11 |   |   |   p ← (p - 1) mod n
12 |   |   |   while a_p ≠ 1 do
13 |   |   |   |   p ← (p - 1) mod n
14 |   a_p ← i
```

---

IV. Rewriting with Rank-Modulation Codes

In Gray codes, the states transit along a well designed path. What if we want to use the rank-modulation scheme to store data, and allow the data to be modified in arbitrary ways? Consider an information symbol i∈[l] that is stored using n cells. In general, l might be smaller than n!, so we might end up having permutations that are not used. On the other hand, we can map several distinct permutations to the same symbol i in order to reduce the rewrite cost. We let $W_n \subseteq S_n$ denote the set of states (i.e., the set of permutations) that are used to represent information symbols. We define two functions, an interpretation function, φ, and an update function, μ.

Definition 12. The interpretation function $\phi: W_n \to [l]$ maps every state $s \in W_n$ to a value φ(s) in [l]. Given an "old state" $s \in W_n$ and a "new information symbol" i∈[l], the update function $\mu: W_n \times [l] \to W_n$ produces a state μ(s, i) such that φ(μ(s, i))=i.

When we use n cells to store an information symbol, the permutation induced by the charge levels of the cells represents the information through the interpretation function. When the information symbol changes, the permutation is changed using the "push-to-the-top" operations based on the update function. The number of "push-to-the-top" operations determines not only the rewriting delay but also how much closer the highest cell-charge level is to the system limit (and therefore how much closer the cell block is to the next costly erase operation). The objective of the coding scheme is to minimize the number of "push-to-the-top" operations.

Definition 13. Given two states $s_1, s_2 \in W_n$, the cost of changing $s_1$ into $s_2$, denoted $\alpha(s_1 \to s_2)$, is defined as the minimum number of "push-to-the-top" operations needed to change $s_1$ into $s_2$.

For example, α([1, 2, 3]→[2, 1, 3])=1, α([1, 2, 3]→[3, 2, 1])=2. We define two important measures: the worst-case rewrite cost and the average rewrite cost.

Definition 14. The worst-case rewrite cost is defined as: $\max_{s \in W_n, i \in [l]} \alpha(s \to \mu(s, i))$. Assume input symbols are i.i.d. random variables having value i∈[l] with probability $p_i$. Given a fixed $s \in W_n$, the average rewrite cost given s is defined as $A(s) = \sum_{i \in [l]} p_i \alpha(s \to \mu(s, i))$. If we further assume some stationary probability distribution over the states $W_n$, where we denote the probability of state s as $q_s$, then the average rewrite cost of the code is defined as $\sum_{s \in W_n} q_s A(s)$. (Note that for all i∈[l], $p_i = \sum_{s \in \{s' \in W_n | \phi(s')=i\}} q_{s'}$.)

In this section, we present a code that minimizes the worst-case rewrite cost. In the next section, we focus on codes with good average rewrite cost.

A. Lower Bound

We start by presenting a lower bound on the worst-case rewrite cost. Define the transition graph G=(V, E) as a directed graph with $V=S_n$, that is, with n! vertices representing the permutations in $S_n$. For any u, v∈V, there is a directed edge from u to v iff α(u→v)=1. G is a regular digraph, because every vertex has n−1 incoming edges and n−1 outgoing edges. The diameter of G is $\max_{u,v \in V} \alpha(u \to v) = n-1$.

Given a vertex u∈V and an integer r∈{0, 1, . . . , n−1}, define the ball centered at u with radius r as $B_r^n(u) = \{v \in V | \alpha(u \to v) \leq r\}$, and define the sphere centered at u with radius r as $S_r^n(u) = \{v \in V | \alpha(u \to v) = r\}$. Clearly, $B_r^n(u) = \cup_{0 \leq i \leq r} S_i^n(u)$. By a simple relabeling argument, both $B_r^n(u)$ and $S_r^n(u)$ are independent of u, and so will be denoted by $|B_r^n|$ and $|S_r^n|$ respectively.

Lemma 15. For any $0 \leq r \leq n-1$, $$|B_r^n| = \frac{n!}{(n-r)!}$$

$$|S_r^n| = \begin{cases} 1, & r = 0 \\ \dfrac{n!}{(n-r)!} - \dfrac{n!}{(n-r+1)!}, & 1 \leq r \leq n-1 \end{cases}$$

Proof: Fix a permutation u∈V. Let $P_u$ be the set of permutations having the following property: for each permutation v∈$P_u$, the elements appearing in its last n−r positions appear in the same relative order in u. For example, if n=5, r=2, u=[1, 2, 3, 4, 5] and v=[5, 2, 1, 3, 4], the last 3 elements of v→namely, 1, 3, 4→have the same relative order in u. It is easy to see that given u, when the elements occupying the first r positions in v∈$P_u$ are chosen, the last n−r positions become fixed. There are n(n−1) . . . (n−r+1) choices for occupying the first r positions of v∈$P_u$, hence $$|P_u| = \frac{n!}{(n-r)!}.$$

We will show that a vertex v is in $B_r^n(u)$ if and only if v∈$P_u$.

Suppose v∈$B_r^n(u)$. It follows that v can be obtained from u with at most r "push-to-the-top" operations. Those elements pushed to the top appear in the first r positions of v, so the last n−r positions of v contain elements which have the same relative order in u, thus, v∈$P_u$.

Now suppose v∈$P_u$. For i∈[n], let $v_i$ denote the element in the i-th position of v. One can transform u into v by sequentially pushing $v_r, v_{r-1}, \ldots, v_1$ to the top. Hence, v∈$B_r^n(u)$.

We conclude that $$|B_r^n(u)| = P = \frac{n!}{(n-r)!}.$$

Since $B_r^n(u) = \cup_{0 \leq i \leq r} S_i^n(u)$, the second claim follows.

The following lemma presents a lower bound on the worst-case rewrite cost.

Lemma 16. Fix integers n and l, and define ρ(n, l) to be the smallest integer such that $|B_{\rho(n,l)}^n| \geq l$. For any code $W_n$ and any state s∈$W_n$, there exists i∈[l] such that α(s→μ(s, i))≥ρ(n, l), i.e., the worst-case rewrite cost of any code is at least ρ(n, l).

Proof: By the definition of ρ(n, l), $|B_{\rho(n,l)-1}^n| < l$. Hence, we can choose i∈[l]\{φ(s')|s'∈$B_{\rho(n,l)-1}^n(s)$}. Clearly, by our choice α(s→μ(s, i))≥ρ(n, l).

B. Optimal Code

We now present a code construction. It will be shown that the code has optimal worst-case performance. First, let us define the following notation.

Definition 17. A prefix sequence a=[$a^{(1)}, a^{(2)}, \ldots, a^{(m)}$] is a sequence of m≤n distinct symbols from [n]. The prefix set $P_n(a) \subset S_n$ is defined as all the permutations in $S_n$ which start with the sequence a.

We are now in a position to construct the code.

Construction 18. Arbitrarily choose l distinct prefix sequences, $a_1, \ldots, a_l$, each of length ρ(n, l). Let us define $W_n = \cup_{i \in [l]} P_n(a_i)$ and map the states of $P_n(a_i)$ to i, i.e., for each i∈[l] and s∈$P_n(a_i)$, set φ(s)=i.

Finally, to construct the update function μ, given s∈$W_n$ and some i∈[l], we do the following: let [$a_i^{(1)}, a_i^{(2)}, \ldots, a_i^{(\rho(n,l))}$] be the first ρ(n, l) elements which appear in all the permutations in $P_n(a_i)$. Apply push-to-the-top on the elements $a_i^{(\rho(n,l))}, \ldots, a_i^{(2)}, a_i^{(1)}$ in s to get a permutation s'∈$P_n(a_i)$ for which, clearly, φ(s')=i. Set μ(s, i)=s'.

Theorem 19. The code in Construction 18 is optimal in terms of minimizing the worst-case rewrite cost.

Proof: First, the number of length m prefix sequences is $$\frac{n!}{(n-m)!} = |B_m^n|.$$

By definition, the number of prefix sequences of length ρ(n, l) is at least l, which allows the first of the construction. To complete the proof, it is obvious from the description of μ that the worst-case rewrite cost of the construction is at most ρ(n, l). By Lemma 16 this is also the best we can hope for.

Example 20. Let n=3, l=3. Since $|B_1^3|=3$, it follows that ρ(n, l)=1. We partition the n!=6 states into $$\frac{n!}{(n-\rho(n,l))!} = 3$$

sets, which induce the mapping:

$P_3([1]) = \{[1,2,3][1,3,2]\} \mapsto 1,$ $P_3([2]) = \{[2,1,3][2,3,1]\} \mapsto 2,$ $P_3([3]) = \{[3,1,2][3,2,1]\} \mapsto 3,$ The cost of any rewrite operation is at most 1.

V. Optimizing Average Rewrite Cost

In this section, we study codes that minimize the average rewrite cost. We first present a prefix-free code that is optimal in terms of its own design objective. Then, we show that this prefix-free code minimizes the average rewrite cost with an approximation ratio 3 if 1≤n!/2, and when 1≤n!/6, the approximation ratio is further reduced to 2.

A. Prefix-Free Code

The prefix-free code we propose consists of l prefix sets $P_n(a_1), \ldots, P_n(a_l)$ (induced by l prefix sequences $a_1, \ldots, a_l$) which we will map to the l input symbols: for every i∈[l] and s∈$P_n(a_i)$, we set φ(s)=i. Unlike the previous section, the prefix sequences are no longer necessarily of the same length. We do, however, require that no prefix sequence be the prefix of another.

Figures 11A, 11B, 12:
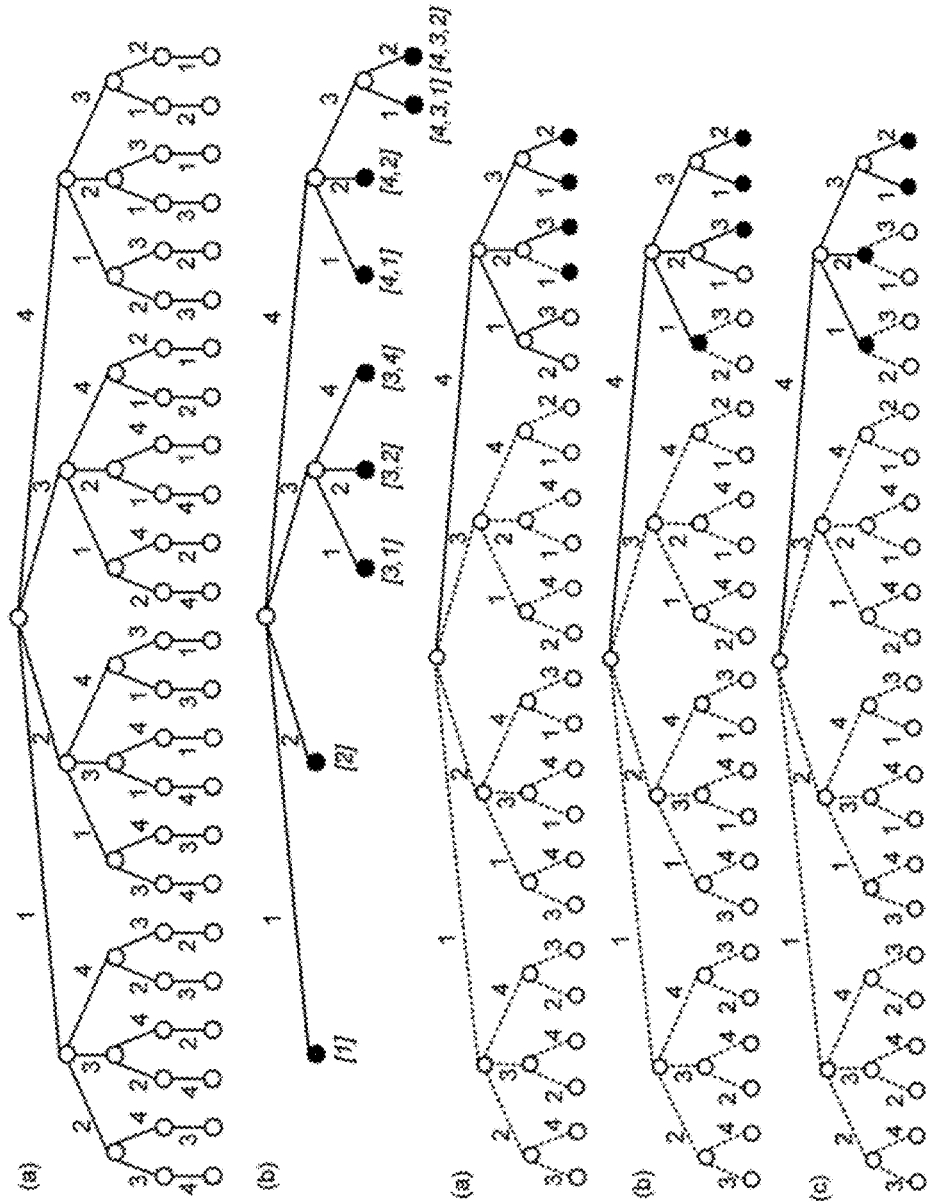
FIG. 11A is a tree diagram that shows a full permutation tree for a code with n=9 and l=9.
FIG. 11B is a tree diagram that shows a prefix-free code with n=9 and l=9 for use in a storage device.

A prefix-free code can be represented graphically by a tree diagram. FIG. 11A and FIG. 11B depict tree diagrams for permutations useful in rank modulation codes. First, let us define a full permutation tree T as follows. The vertices in T are placed in n+1 layers, where the root is in layer 0 and the leaves are in layer n. Edges only exist between adjacent layers. For i=0, 1, . . . , n−1, a vertex in layer i has n−i children. The edges are labeled in such a way that every leaf corresponds to a permutation from $S_n$ which may be constructed from the labels on the edges from the root to the leaf. This example corresponds to the tree given in FIG. 11A, the upper tree of the illustration, for n=4 and l=9. A prefix-free code corresponds to a subtree C of T. An example of a subtree prefix-free code is given by FIG. 11B, the lower tree of the illustration. Every leaf is mapped to a prefix sequence which equals the string of labels as read on the path from the root to the leaf.

For i∈[l], let $a_s$ denote the prefix sequence representing i, and let $|a_i|$ denote its length. For example, the prefix sequences in FIG. 4(b) have minimum length 1 and maximum length 3. The average codeword length is defined as $$\sum_{i=1}^{l} p_i |a_i|.$$

Here the probabilities $p_i$ are as defined before, that is, information symbols are i.i.d. random variables having value $i \in [l]$ with probability $p_i$. We can see that with the prefix-free code, for every rewrite operation (namely, regardless of the old permutation before the rewriting), the expected rewrite cost is upper bounded by $\sum_{i=1}^{l} p_i |a_i|$. Our objective is to design a prefix-free code that minimizes its average codeword length.

Example 21. Let $n=4$ and $l=9$, and let the prefix-free code be as shown in FIG. 11B. We can map the information symbols $i \in [l]$ to the prefix sequences $a_i$ as follows:

$a_1 = [1]$
$a_4 = [3, 2]$
$a_7 = [4, 2]$
$a_2 = [2]$
$a_5 = [3, 4]$
$a_8 = [4, 3, 1]$
$a_3 = [3, 1]$
$a_6 = [4, 1]$
$a_9 = [4, 3, 2]$

Then, the mapping from the permutations to the information symbols is given by Table 2 below:

TABLE 2

$P_4([1]) = \{[1, 2, 3, 4], [1, 2, 4, 3], \ldots, [1, 4, 3, 2]\} \mapsto 1$
$P_4([2]) = \{[2, 1, 3, 4], [2, 1, 4, 3], \ldots, [2, 4, 3, 1]\} \mapsto 2$
$P_4([3, 1]) = \{[3, 1, 2, 4], [3, 1, 4, 2]\} \mapsto 3$
$P_4([3, 2]) = \{[3, 2, 1, 4], [3, 2, 4, 1]\} \mapsto 4$
$P_4([3, 4]) = \{[3, 4, 1, 2], [3, 4, 2, 1]\} \mapsto 5$
$P_4([4, 1]) = \{[4, 1, 2, 3], [4, 1, 3, 2]\} \mapsto 6$
$P_4([4, 2]) = \{[4, 2, 1, 3], [4, 2, 3, 1]\} \mapsto 7$
$P_4([4, 3, 1]) = \{[4, 3, 1, 2]\} \mapsto 8$
$P_4([4, 3, 2]) = \{[4, 3, 2, 1]\} \mapsto 9$ Assume that the current state of the cells is $[1, 2, 3, 4] \in P_4([1])$, representing the information symbol 1. If we want to rewrite the information symbol as 8, we can shift cells 3, 4 to the top to change the state to $[4, 3, 1, 2] \in P_4([4, 3, 1])$. This rewrite cost is 2, which does not exceed $|a_8|=3$. In general, given any current state, considering all the possible rewrites, the expected rewrite cost is always less than $\sum_{i=1}^{l} p_i |a_i|$, the average codeword length.

The optimal prefix-free code cannot be constructed with a greedy algorithm like the Huffman code, because the internal nodes in different layers of the full permutation tree T have different degrees, making the distribution of the vertex degrees in the code tree C initially unknown. The Huffman code is a well-known variable-length prefix-free code, and many variations of it have been studied. See, for example, Huffman, D. A. *Proceedings of the Institute of Radio Engineers*, 40(9):1098-1101, (1952). In Hwang, F. K. *SIAM J. Appl. Math.*, 37(1):124-127, (1979), the Huffman code construction was generalized, assuming that the vertex-degree distribution in the code tree is given. In Baer, M. B. *IEEE Trans. on Inform. Theory*, 54(3):1273-1286, (2008), prefix-free codes for infinite alphabets and nonlinear costs were presented. When the letters of the encoding alphabet have unequal lengths, only exponential-time algorithms are known, and it is not known yet whether this problem is NP hard. See, for example, Golin, M. J. et al., *IEEE Trans. on Inform. Theory*, 44(5):1770-1781, (1998). To construct prefix-free codes for our problem, which minimize the average codeword length, we present a dynamic-programming algorithm of time complexity $O(nl^4)$. Note that without loss of generality, we can assume the length of any prefix sequence to be at most $n-1$.

The algorithm computes a set of functions $opt_i(x, m)$, for $i=1, 2, \ldots, n-1$, $x=0, 1, \ldots, l$, and $m=0, 1, \ldots, \min\{l, n!/(n-i)!\}$. We interpret the meaning of $opt_i(x, m)$ as follows. We take a subtree of T that contains the root. The subtree has exactly x leaves in the layers $i, i+1, \ldots, n-1$. It also has at most m vertices in the layer i. We let the x leaves represent the x letters from the alphabet $[l]$ with the lowest probabilities $p_j$: the further the leaf is from the root, the lower the corresponding probability. Those leaves also form x prefix sequences, and we call their weighted average length (where the probabilities $p_j$ are weights) the value of the subtree. The minimum value of such a subtree (among all such subtrees) is defined to be $opt_i(x, m)$. In other words, $opt_i(x, m)$ is the minimum average prefix-sequence length when we assign a subset of prefix sequences to a subtree of T (in the way described above). Clearly, the minimum average codeword length of a prefix-free code equals $opt_1(l, n)$.

Without loss of generality, let us assume that $p_1 \leq p_2 \leq \ldots \leq p_l$. It can be seen that the following recursions hold:

When $i = n - 1$ and $m \geq x > 0$, $$opt_i(x, m) = (n-1)\sum_{k=1}^{x} p_k.$$

When $i \geq 1$ and $x = 0$, $$opt_i(x, m) = 0.$$

When $x > m \cdot (n-i)!$, $$opt_i(x, m) = \infty.$$

When $i < n - 1$ and $0 < x \leq m \cdot (n-i)!$, $$opt_i(x, m) = \min_{0 \leq j \leq \min\{x, m\}} \left\{ opt_{i+1}(x - j, \min\{l, (m-j) \cdot (n-i)\}) + \sum_{k=x-j+1}^{x} i p_k \right\}.$$

The last recursion holds because a subtree with x leaves in layers $i, i+1, \ldots, n-1$ and at most m vertices in layer i can have $0, 1, \ldots, \min\{x, m\}$ leaves in layer i.

The algorithm first computes $opt_{n-1}(x, m)$, then $opt_{n-2}(x, m)$, and so on, until it finally computes $opt_1(l, n)$, by using the above recursions. Given these values, it is straightforward to determine in the optimal code, how many prefix sequences are in each layer, and therefore determine the optimal code itself. It is easy to see that the algorithm returns an optimal code in time $O(nl^4)$.

Example 22. Let $n=4$ and $l=9$, and let us assume that $p_1 \leq p_2 \leq \ldots \leq p_l$. As an example, let's consider how to compute $opt_2(4, 3)$.

By definition, $opt_2(4, 3)$ corresponds to a subtree of T with a total of four leaves in layer 2 and layer 3, and with at most three vertices in layer 2. Thus, there are four cases to consider: either there are 0, 1, 2, or 3 leaves in layer 2. The corresponding subtrees in the first three cases are as shown in the tree diagrams of FIGS. 12A, 12B, 12C, respectively. The fourth case is actually impossible, because it leaves no place for the fourth leaf to exist in the subtree.

In FIGS. 12A, 12B, and 12C, the solid-line edges are the remaining edges in the full-permutation tree T. The leaves in the respective subtrees are shown as black vertices. In FIG. 12A, there are no leaves in layer 2. In FIG. 12B, there is one leaf in layer 1. In FIG. 12C, there are two leaves in layer 2.

If layer 2 has i leaves ($0 \leq i \leq 3$), then layer 3 has $4-i$ leaves and there can be at most $(3-i) \cdot 2$ vertices in layer 3 of the subtree. To assign $p_1$, $p_2$, $p_3$, $p_4$ to the four leaves and minimize the weighted average distance of the leaves to the root (which is defined as $opt_2(4, 3)$), among the four cases mentioned above, we choose the case that minimizes that weighted average distance. Therefore, $$opt_2(4, 3) = \min\{opt_3(4-0, (3-0)\cdot 2),$$
$$opt_3(4-1, (3-1)\cdot 2) + 2p_4,$$
$$opt_3(4-2, (3-2)\cdot 2) + 2p_3 + 2p_4,$$
$$opt_3(4-3, (3-3)\cdot 2) + 2p_2 + 2p_3 + 2p_4\}$$
$$= \min\{3p_1 + 3p_2 + 3p_3 + 3p_4,$$
$$3p_1 + 3p_2 + 3p_3 + 2p_4,$$
$$3p_1 + 3p_2 + 2p_3 + 2p_4, \infty\}$$
$$= 3p_1 + 3p_2 + 2p_3 + 2p_4.$$

Now assume that after computing all the $opt_i(x, m)$ terms, we find that $$opt_1(9,4) = opt_2(9-2, (4-2)\cdot 3) + (p_8+p_9).$$

That means that in the optimal code tree, there are two leaves in layer 1. If we further assume that $$opt_2(7,6) = opt_3(7-5, (6-5)\cdot 2) + (2p_3 + 2p_4 + 2p_5 + 2p_6 + 2p_7),$$

we can determine that there are five leaves in layer 2, and the optimal code tree will be as shown in FIG. 11B.

We can use the prefix-free code for rewriting in the following way: to change the information symbol to $i \in [l]$, push at most $|a_i|$ cells to the top so that the jail top-ranked cells are the same as the codeword $a_i$.

B. Performance Analysis

We now analyze the average rewrite cost of the prefix-free code. We obviously have $l \leq n!$. When $l = n!$, the code design becomes trivial—each permutation is assigned a distinct input symbol. In this subsection, we prove that the prefix-free code has good approximation ratios under mild conditions: when $l \leq n!/2$, the average rewrite cost of a prefix-free code (that was built to minimizes its average codeword length) is at most three times the average rewrite cost of an optimal code (i.e., a code that minimizes the average rewrite cost), and when $l \leq n!/6$, the approximation ratio is further reduced to 2.

Loosely speaking, our strategy for proving this approximation ratio involves an initial simple bound on the rewrite cost of any code when considering a rewrite operation starting with a stored symbol $i \in [l]$. We then proceed to define a prefix-free code which locally optimizes (up to the approximation ratio) rewrite operations starting with stored symbol i. Finally, we introduce the globally-optimal prefix-free code of the previous section, which optimizes the average rewrite cost, and show that it is still within the correct approximation ratio.

We start by bounding from below the average rewrite cost of any code, depending on the currently stored information symbol. Suppose we are using some code X with an interpretation function $\phi^X$ and an update function $\mu^X$. Furthermore, let us assume the currently stored information symbol is $i \in [l]$ in some state $s_i \in S_n$, i.e., $\phi^C(s_i) = i$. We want to consider rewrite operations which are meant to store the value $j \in [l]$ instead of i, for all $j \neq i$. Without loss of generality, assume that the probabilities of information symbols are monotonically decreasing, $$p_1 \geq p_2 \geq \ldots \geq p_l.$$

Let us denote by $s'_1, \ldots, s'_{l-1} \in S_n \setminus \{s_i\}$ the $l-1$ closest permutations to $s_i$ ordered by increasing distance, i.e., $$\alpha(s_i \to s'_1) \leq \alpha(s_i \to s'_2) \leq \ldots \leq \alpha(s_i \to s'_{l-1}),$$

and denote $\delta_j = \alpha(s_i \to s'_j)$ for every $j \in [l-1]$. We note that $\delta_1, \ldots, \delta_{l-1}$ are independent of the choice of $s_i$, and furthermore, that $\delta_1 = 1$ while $\delta_{l-1} = \rho(n, 1)$.

The average rewrite cost of a stored symbol $i \in [l]$ using a code X is the weighted sum $$\zeta^C(i) = \sum_{j \in [l], j \neq i} p_j \alpha(s_i \to \mu^C(s_i, j)).$$

This sum is minimized when $\{\mu^C(s^i, j)\}_{j \in [l], j \neq i}$ are assigned the $l-1$ closest permutations to $s_i$ with higher-probability information symbols mapped to closer permutations. For convenience, let us define the function $skip_i: \mathbb{N} \setminus \{i\} \to \mathbb{N}$, $$skip_i(j) = \begin{cases} j & j < i \\ j-1 & j > i. \end{cases}$$

Thus, the average rewrite cost of a stored symbol $i \in [l]$, under any code, is lower bounded by $$\zeta^C(i) \geq \zeta(i) \stackrel{def}{=} \sum_{j \in [l], j \neq i} p_j \delta_{skip_i(j)}.$$

We continue by considering a specific intermediary prefix-free code that we denote by $Z(i)$. Let it be induced by the prefix sequences $z_1^{(i)}, \ldots, z_l^{(i)}$. We require the following two properties:

P.1 For every $j \in [l]$, $j \neq i$, we require $|z_j^{(i)}| \leq 3\delta_{skip_i(j)}$.

P.2 $|z_i^{(i)}| = 1$.

We also note that $Z(i)$ is not necessarily a prefix-free code with minimal average codeword length.

Finally, let A be a prefix-free code that minimizes its average codeword length. Let A be induced by the prefix sequences $a_1, \ldots, a_l$, and let $s \in S_n$ be any state such that $\phi^A(s) = i$. Denote by $\xi^A(s)$ the average rewrite cost of a rewrite operation under A starting from state s.

By the definition of A and $Z(i)$ we have $$\sum_{j \in [l]} p_j |a_j| \leq \sum_{j \in [l]} p_j |z_j^{(i)}|.$$

Since $|a_i| >= 1 = |z_i^{(i)}|$ it follows that $$\zeta^A(s) = \sum_{j \in [l], j \neq i} p_j \alpha(s \to \mu^A(s, j)) \leq$$

$$\sum_{j \in [l], j \neq i} p_j |a_j| \leq \sum_{j \in [l], j \neq i} p_j |z_j^{(i)}| \leq \sum_{j \in [l], j \neq i} 3 p_j \delta_{skip_i(j)} = 3\zeta(i).$$

Since the same argument works for every $s \in P_n(a_i)$, we can say that $$\xi^A(i) \leq 3\xi(i). \quad \text{Equation (2)}$$

It is evident that the success of this proof strategy hinges on the existence of $Z(i)$ for every $i \in [l]$, which we now turn to consider.

The following lemma is an application of the well-known Kraft-McMillan inequality (McMillan, B. IEEE Trans. on Inform. Theory, 2(4):115-116, (1956)).

Lemma 23. Let $r_1, r_2, \ldots, r_{n-1}$ be non-negative integers. There exists a set of prefix sequences with exactly $r_m$ prefix sequences of length m, for $1 \leq m \leq n-1$ (i.e., there are $r_m$ leaves in layer m of the code tree C), if and only if $$\sum_{m=1}^{n-1} r_m \frac{(n-m)!}{n!} \leq 1.$$

Let us define the following sequence of integers:

$$r_m = \begin{cases} 1 & m = 1 \\ |S_{m/3}^n| & 2 \leq m \leq n-2, m \equiv 0 \pmod 3 \\ 0 & 2 \leq m \leq n-2, m \not\equiv 0 \pmod 3 \\ \frac{n!}{2} - \sum_{m'=1}^{n-2} r_{m'}, & m = n-1 \end{cases}$$

We first contend that they are all non-negative. We only need to check $r_{n-1}$ and indeed:

$$r_{n-1} = \frac{n!}{2} - \sum_{m=1}^{n-2} r_m = \frac{n!}{2} - \sum_{m=0}^{\lfloor \frac{n-2}{3} \rfloor} |S_m^n|$$

$$= \frac{n!}{2} - \left|B_{\lfloor \frac{n-2}{3} \rfloor}^n\right| = \frac{n!}{2} - \frac{n!}{\left(n - \lfloor \frac{n-2}{3} \rfloor\right)!}$$

$$\geq 0$$

It is also clear that $$\sum_{m=1}^{n-1} r_m = \frac{n!}{2}.$$

In fact, in the following analysis, $r_1, r_2, \ldots, r_{n-1}$ represent a partition of the $l = n!/2$ alphabet letters.

Lemma 24. When $l = n!/2$, there exists a set of prefix sequences that contains exactly $r_m$ prefix sequences of length m, for $m = 1, 2, \ldots, n-1$.

Proof: Let us denote R(n) as follows:

$$R(n) = \sum_{m=1}^{n-1} r_m \frac{(n-m)!}{n!}. \quad \text{Equation (3)}$$

When $n = 2, 3, 4, 5, 6, 7$, the values of R(n) are $$R(n) = \frac{1}{2}, \frac{2}{3}, \frac{17}{24}, \frac{29}{40}, \frac{7}{10}, \frac{3377}{5040},$$

respectively. Thus, $R(n) \leq 1$ for all $2 \leq n \leq 7$. We now show that when $n \geq 8$, R(n) monotonically decreases in n. Substituting $\{r_m\}$ into Equation (3) we get $$R(n) = \frac{1}{n} + \sum_{m=1}^{\lfloor \frac{n-2}{3} \rfloor} \frac{(n-3m)!}{(n-m+1) \cdot (n-m-1)!} + \frac{1}{2} - \frac{1}{\left(n - \lfloor \frac{n-2}{3} \rfloor\right)!}.$$

After some tedious rearrangement, for any integer $n \geq 8$, $$R(n) - R(n-1) = -\frac{1}{n(n-1)} + \frac{(n \bmod 3)!(n - \lfloor n/3 \rfloor)}{(n - \lfloor n/3 \rfloor + 1)!} -$$

$$\sum_{m=1}^{\lfloor n/3 \rfloor - 1} \left( \frac{(n-1-3m)!}{(n-2-m)!} \cdot \frac{2nm - 2m^2 - 1}{((n-m)^2 - 1)(n-m)} \right) \leq$$

$$-\frac{1}{n(n-1)} + \frac{1}{(n - \lfloor n/3 \rfloor - 1)!} < 0.$$

Hence, R(n) monotonically decreases for all $n \geq 8$ which immediately gives us $R(n) \leq 1$ for all $n \geq 2$. By Lemma 23, the proof is complete.

We are now in a position to show the existence of $Z(i)$, $i \in [l]$, for $l = n!/2$. By Lemma 24, let $z_1, z_2, \ldots, z_l$ be a list of prefix sequences, where exactly $r_m$ of the sequences are of length m. Without loss of generality, assume $$1 = |z_1| \leq |z_2| \leq \ldots \leq |z_l|.$$

Remember we also assume $$p_1 \geq p_2 \geq \ldots \geq p_l.$$

We now define $Z(i)$ to be the prefix-free code induced by the prefix sequences $$z_1^{(i)} = z_2 \quad z_2^{(i)} = z_3 \quad \ldots \quad z_{i-1}^{(i)} = z_i$$

$$z_i^{(i)} = z_1$$

$$z_{i+1}^{(i)} = z_{i+1} \quad \ldots \quad z_{l-1}^{(i)} = z_{l-1} \quad z_l^{(i)} = z_l,$$

that is, for all $j \in [l]$, $$z_j^{(i)} = \begin{cases} z_1 & j = i \\ z_{skip_i(j)+1} & j \in [l], j \neq i \end{cases}$$

Note that for all $j \in [l]$, the prefix sequence $z_j^{(i)}$ represents the information symbol j, which is associated with the probability $p_j$ in rewriting.

Lemma 25. The properties P.1 and P.2 hold for $Z(i)$, $i \in [l]$.

Proof: Property P.2 holds by definition, since $z_i^{(i)} = z_1$ whose length is set to $|z_1| = 1$. To prove property P.1 holds, we first note that when $l = n!/2$, for all $r \in [n-2]$ there are exactly $|S_r^n|$ indices j for which $\delta_j = r$. On the other hand, when $l = n!/2$, among the prefix sequences $z_2, \ldots, z_l$ we have $|S_r^n|$ of them of length 3r when $3 \leq 3r \leq n-2$, and the rest of them are of length $n-1$. Intuitively speaking, we can map the $|S_1^n|$ indices j for which $\delta_j = 1$ to distinct prefix sequences of length 3, the $|S_2^n|$ indices j for which $\delta_j = 2$ to distinct prefix sequences of length 6, and so on.

Since the prefix sequences are arranged in ascending length order, $$|z_2| \leq |z_3| \leq \ldots \leq |z_l|,$$

It follows that for every $j \in [l] \neq i$, $$|z_j^{(i)}| = |z_{skip_i(j)+1}| \leq 3\delta_{skip_i(j)}.$$

Hence, property P.1 holds.

We can now state the main theorem.

Theorem 26. Fix some $1 \leq n!/2$ and let A be a prefix-free code over [l] which minimizes its average codeword length. For any rewrite operation with initial stored information symbol $i \in [l]$, $$\xi^A(i) \leq 3\xi(i),$$

i.e., the average cost of rewriting i under A is at most three times the lower bound.

Proof: Define $l' = n!/2$ and consider the input alphabet $[l']$ with input symbols being i.i.d random variables where symbol $i \in [l']$ appears with probability $p'_i$. We set $$p'_i = \begin{cases} p_i & i \in [l] \\ 0 & i \in [l'] \setminus [l] \end{cases}.$$

Let A' be a prefix-free code over $[l']$ which minimizes its average codeword length.

A crucial observation is the following: $\xi(i)$, the lower bound on the average rewrite cost of symbol i, does depend on the probability distribution of the input symbols. Let us therefore distinguish between $\xi(i)$ over $[l]$, and $\xi'(i)$ over $[l']$. However, by definition, and by our choice of probability distribution over $[l]$, $$\zeta(i) = \sum_{j \in [l], j \neq i} p_j \delta_{skip_i(j)} = \sum_{j \in [l'], j \neq i} p'_j \delta_{skip_i(j)} = \zeta'(i)$$

for every $i \in [l]$.

Since A' is a more restricted version of A, it obviously follows that $$\xi^A(i) \leq \xi^{A'}(i)$$

for all $i \in [l]$. By applying inequality (2), and since by Lemma 25 the code Z(i) exists over $[l]$, we get that $$\xi^A(i) \leq \xi^{A'}(i) \leq 3\xi'(i) = 3\xi(i),$$

for every $i \in [l]$.

Corollary 27. When $1 \leq n!/2$, the average rewrite cost of a prefix-free code minimizing its average codeword length is at most three times that of an optimal code.

Proof: Since the approximation ratio of 3 holds for every rewrite operation (regardless of the initial state and its interpretation), it also holds for any average case.

With a similar analysis, we can prove the following result:

Theorem 28. Fix some $1 \leq n!/6$, $n \geq 4$, and let A be a prefix-free code over [l] which minimizes its average codeword length. For any rewrite operation with initial stored information symbol $i \in [l]$, $$\xi^A(i) \leq 2\xi(i),$$

i.e., the average cost of rewriting i under A is at most twice the lower bound.

Corollary 29. When $1 \leq n!/6$, $n \geq 4$, the average rewrite cost of a prefix-free code minimizing its average codeword length is at most twice that of an optimal code.

We provide a proof of Theorem 28. The general approach is similar to the proof of Theorem 26, so we only specify some details that are relatively important here.

We define the following sequence of numbers:

$$q_m = \begin{cases} 1 & m = 1 \\ |S_{m/2}^n| & 2 \leq m \leq n-2, m \equiv 0 \pmod 2 \\ 0 & 2 \leq m \leq n-2, m \not\equiv 0 \pmod 2 \\ \dfrac{n!}{6} - \sum_{m'=1}^{n-2} q_{m'} & m = n-1 \end{cases}$$

Like before, we contend that they are all non-negative. We only need to check $q_{n-1}$ and indeed, for $n \geq 4$, $$q_{n-1} = \frac{n!}{6} - \sum_{m=1}^{n-2} q_m = \frac{n!}{6} - \sum_{m=0}^{\lfloor \frac{n-2}{3} \rfloor} |S_m^n|$$

$$= \frac{n!}{6} - \left| B_{\lfloor \frac{n-2}{2} \rfloor}^n \right| = \frac{n!}{6} - \frac{n!}{\left(n - \lfloor \frac{n-2}{2} \rfloor\right)!}$$

$$\geq 0$$

We now prove the equivalent of Lemma 24.

Lemma 30. When $l = n!/6$, $l \geq 4$, there exists a set of prefix sequences that contains exactly $q_m$ prefix sequences of length m, for $m = 1, 2, \ldots, n-1$.

Proof: Let us denote $$Q(n) = \sum_{m=1}^{n-1} q_m \frac{(n-m)!}{n!}.$$

When $n = 4, 5, 6, 7, 8, 9, 10$, the values of Q(n) are $$Q(n) = \frac{1}{2}, \frac{21}{40}, \frac{21}{40}, \frac{17}{35}, \frac{142}{315}, \frac{349}{840}, \frac{977}{2520}$$

respectively. Thus, $Q(n) \leq 1$ for all $4 \leq n \leq 10$. We now show that when $n \geq 11$, Q(n) monotonically decreases in n. Substituting $\{q_m\}$ into the formula for Q(n) we get $$Q(n) = \frac{1}{n} + \sum_{m=1}^{\lfloor \frac{n-2}{2} \rfloor} \frac{(n-2m)!}{(n-m+1) \cdot (n-m-1)!} + \frac{1}{6} - \frac{1}{\left(n - \lfloor \frac{n-2}{2} \rfloor\right)!}.$$

After some tedious rearrangement, for any integer $n \geq 11$, $$Q(n) - Q(n-1) = -\frac{1}{n(n-1)} + \frac{(2-(n\bmod 2))!(n-\lfloor n/2 \rfloor)}{(n-\lfloor n/2 \rfloor+1)!} -$$

$$\sum_{m=1}^{\lfloor (n-1)/2 \rfloor - 1} \left( \frac{(n-1-2m)!}{(n-2-m)!} \cdot \frac{nm-m^2-1}{((n-m)^2-1)(n-m)} \right) \leq$$

$$-\frac{1}{n(n-1)} + \frac{1}{(n-\lfloor n/3 \rfloor - 1)!} < 0.$$

Hence, $Q(n)$ monotonically decreases for all $n \geq 11$ which immediately gives us $Q(n) \leq 1$ for all $n \geq 4$. By Lemma 23, the proof is complete.

The remaining lemmas comprising the rest of the proof procedure are similar to those of Section V-B, Performance Analysis, and are not listed here.

VI. Joint Coding for Load Balancing

One of the major challenges for flash memories is load balancing. It happens when some data are modified more frequently than others, which is common in many applications. For the cells storing the most frequently modified variable, their levels rise to the maximum level faster than any other cell. The next modification of the variable requires a block erasure and lots of cell reprogramming. Lowering the level of any cell requires erasing the whole block, and a block contains many ($\sim 10^5$) cells. The fundamental problem is that when data have uneven modification frequencies, many cells are under-used. The consequent block erasures and reprogramming significantly reduce the average write speed and power efficiency. The solution is to balance the usage of cells, which requires the joint modulation of variables. To solve the load balancing problem, we will study a potentially very powerful generalization of rank modulation coding.

We illustrate the joint modulation of variables with the following example. Consider using n cells to store two ternary variables. There are two approaches: separate coding, and joint coding. With separate coding, n/2 cells are used to store each variable. The rank modulation code in Example 1 can be used. That is, partition the n/2 cells into groups of three, and use them sequentially to store the variable. Its performance can be measured as follows. Since the code in Example 1 uses the full order of cells to represent data, let $\Delta$ denote the margin between two adjacent cell levels. For simplicity, assume $\Delta$ to be a constant. Let $V_{max}$ denote the maximum level for cells. Then, when the variable is initially written, the cell levels are 0, $\Delta$, and $2\Delta$. Each rewriting of the variable raises a cell's level to the top, so a group of three cells support $$\frac{V_{max}}{\Delta} - 1$$

writes. The n/2 cells totally support $$\frac{n}{6}\left(\frac{V_{max}}{\Delta} - 1\right)$$

writes. When the two variables have different modification frequencies, in the worst case—when all the modifications happen to one of the two variables—the n cells support only $$\frac{n}{6}\left(\frac{V_{max}}{\Delta} - 1\right)$$

writes, after which a block erasure becomes necessary.

We now present a joint coding approach, whose performance can be much better. The approach can be generalized to more than two variables as well. For simplicity, assume that n=ab, where a, b are both integers. Name the n cells as if they are in an array with a rows and b columns: call the cells $c_{i,j}$, where $1 \leq i \leq a$, $1 \leq j \leq b$. For each row, the b cells are divided into three types based on their functions: $c_{i,1}$, $c_{i,2}$, $c_{i,3}$ are index cells, $c_{i,4}$ is the reference cell, and the other b−4 cells—$c_{i,5}, \ldots, c_{i,b}$—are counting cells. Let $L(c_{i,j})$ denote the level of the cell $c_{i,j}$. We use $V_1$, $V_2$ to denote the two ternary variables, and use three integers 0, 1, and 2 to denote their values. The two variables are stored using the partial order of the n cells in the following way:

The rows have five types: type-1, type-2, . . . , type-5. The type of a row is determined by the full order of its three index cells. (Three cells can have six orders, so it is doable.) Let's use $S_j$ to denote the set of rows of type-j, where $S_j \subseteq \{1, 2, \ldots, a\}$. For a row—let's say the i-th row—let $\overline{C}_i$ denote the number of counting cells whose levels are all higher than the reference cell. That is, $\overline{C}_i = |\{c_{i,j} | L(c,j) > L(c_{i,4}), 5 \leq j \leq b\}|$.

The type-1 and type-2 rows (respectively, type-3 and type-4 rows) are used to represent the variable $V_1$ (respectively, $V_2$), as follows:

$$V_1 = \sum_{i \in S_1} \overline{C}_i + \sum_{i \in S_2} 2\overline{C}_i$$

(mod 3), and $$V_2 = \sum_{i \in S_3} \overline{C}_i + \sum_{i \in S_4} 2\overline{C}_i \pmod{3}.$$

Those type-5 rows represent neither variable.

In each row, if a counting cell's level is higher than the reference cell, we call it set; otherwise, it is un-set. When $V_1$ changes its value, its new value minus its old value equals either 1 or 2 (modulo 3). So to store its new value, we can pick a type-1 or type-2 row and set one more counting cell there. If all the counting cells there are already set, raise the reference cell's level so that those counting cells become un-set again. If the cells in the row have reached the maximum level, change a type-5 row into a type-1 or type-2 row and do the same. Finally, notice that we also have the option of setting two counting cells in a type-1 or type-2 row for a write (if necessary). For variable $V_2$, its value is rewritten in a similar way.

With the above approach, if we look at the rows whose cells have not reached the maximum level, at most four of them are of type 1, 2, 3, or 4 at any moment. In the end, only two or fewer such rows are left. So most of the cells are fully used. It is simple to show that with this approach, the n cells support at least $$\left[(a-2)\left(\frac{V_{max}}{\Delta} \times \frac{1}{2} - 1\right) - \frac{1}{2}\right](b-4)$$

writes, no matter how unevenly the two variables are modified. This can be much better than the separate coding approach when n is sufficiently large. For example, when n>>4, by setting a=b=√n, the joint coding approach guarantees to support nearly $$\frac{n}{2} \cdot \frac{V_{max}}{\Delta}$$

writes, while the separate coding approach only guarantees nearly $$\frac{n}{6} \cdot \frac{V_{max}}{\Delta}$$

writes. That is a 200% increase in the rewriting performance.

When more variables are jointly coded, more cell levels will be balanced. Therefore, the rewriting performance will become better. In fact, the above joint coding approach can be generalized to jointly store k l-ary variables, for any k≧1 and l≧2. Compared to separate coding, the increase in the rewriting performance can be nearly $$\left(\frac{kl}{2} - 1\right) \times 100\%.$$

Therefore, joint coding—which generalizes the rank permutation coding—is a potentially very powerful tool to balance cell loads.

The above code for load balancing can be generalized to a code that uses the partial order of n cells' levels to jointly store k l-ary variables. Compared to separate storage of the k variables, this code can rewrite the variables nearly $$\left(\frac{kl}{2} - 1\right)$$

times more when n is large.

Load balancing is a bottleneck hindering the improvement of flash memories. By jointly storing multiple variables, no matter how uneven the variables' modification frequencies are, the number of allowed rewrites can still be large. This way, we can significantly improve the average write speed and power efficiency. Such a coding scheme is especially suitable for NOR flash memories, which have random access to cells. It is fundamentally different from the wear-leveling techniques used in current flash file systems, which are techniques for balancing the usage of the blocks (not the cells in a block), so that the blocks wear out evenly. Wear-leveling does not really reduce block erasures. Joint coding, on the contrary, aims at reducing block erasures as much as possible. See, for example, P. Cappelletti et al. supra, E. Gal et al., supra, and Saifun Semiconductors Ltd. Web site, available at the Internet URL of www.saifun.com.

VII. Operation and Embodiments

Figure 13:
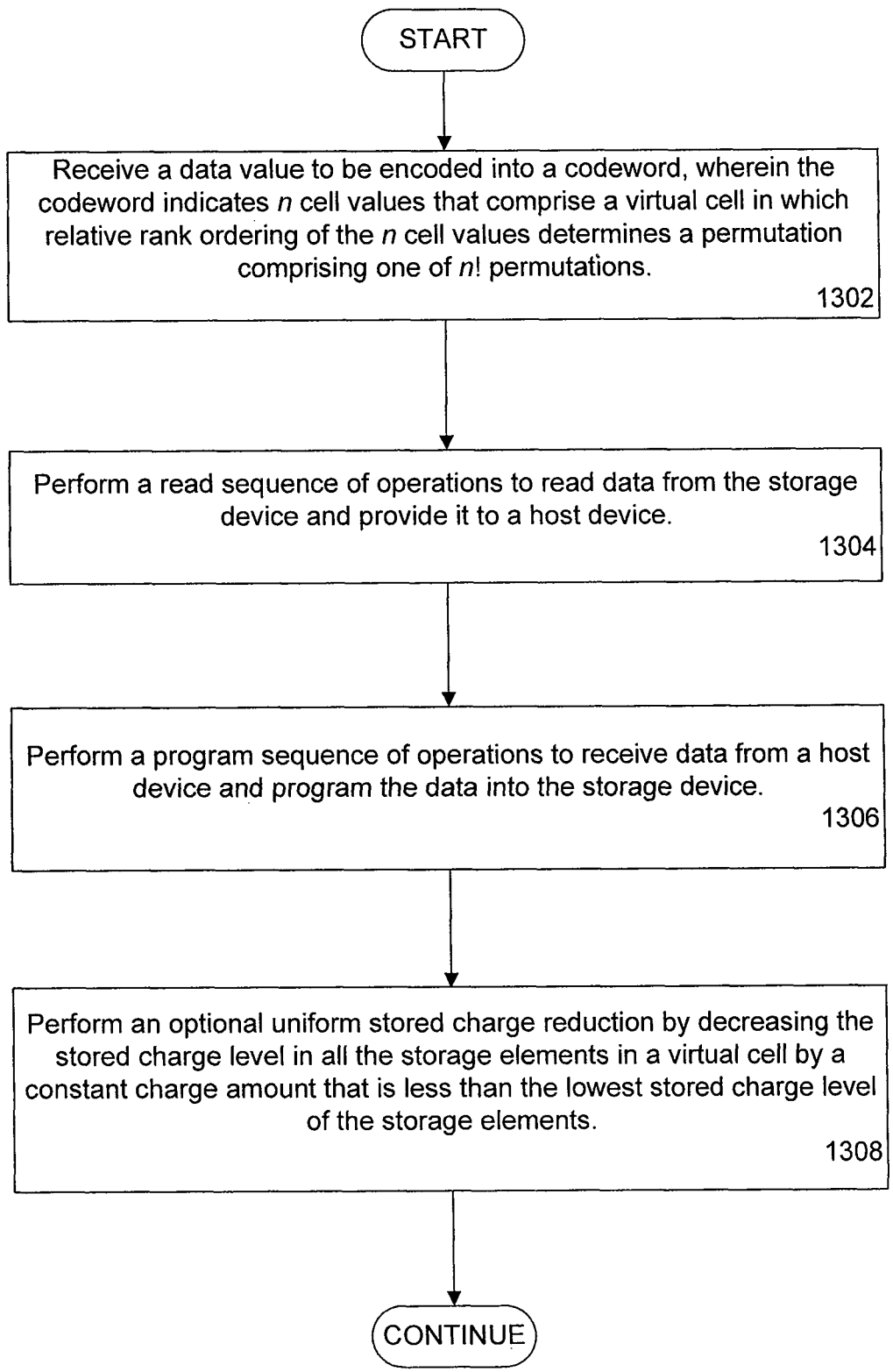
FIG. 13 is a flow diagram that shows the operations of a data storage device constructed in accordance with the description herein.

FIG. 13 is a flow diagram that shows the operations of a data storage device using the rank modulation coding scheme as described herein. The data storage device may comprise a variety of systems and components, whether as a device external to computing devices for data storage, or integrated with other components of a system for data storage. The data storage device may be implemented, for example, as a Flash memory external device, such as a USB-compatible "thumb drive" or the like, or the storage device may be implemented as an internal component such as a "solid state drive" (SSD) for use in place of a hard disk drive in desktop and laptop computers. The data storage device receives data for programming (storage) from a host device, and provides data read from the data storage to a host device. Data passes to and from the data storage device over a data channel. For example, in the case of a thumb drive, the host device may comprise the computing device with which the thumb drive communicates via the USB data channel, and in the case of the SSD, the host device may comprise the SSD controller that manages the data interface to an associated system bus of a computer in which the SSD is installed.

A data storage device that operates in accordance with the rank modulation scheme determines a permutation of a codeword that corresponds to a data value. That is, such a device represents permutations as cells such that a group of cells represent a single virtual cell associated with a permutation corresponding to data. This is illustrated by the flow chart box 1302 of FIG. 13, which shows that the device receives a data value to be encoded into a codeword, wherein the codeword indicates n cell values that comprise a virtual cell in which relative rank ordering of the n cell values determines a permutation comprising one of n! permutations. The device generates a permutation A corresponding to the codeword, wherein A is given by A=[$a_1, a_2, \ldots, a_n$] integer values such that the [$a_1, a_2, \ldots, a_n$] permutation conforms to a rank modulation scheme for data representation in which the $a_i$ values are arranged in rank order. Having generated the permutation, the device then provides the permutation to a data destination over an information channel. The data destination may comprise memory cells, such as flash memory, or the data destination may comprise a transmitter, in the case where the cells comprise signal features, as explained further in the next paragraph.

As noted previously, storage elements may be associated with respective levels of stored charge, and the $a_i$ values of the permutation A may be stored in the storage elements by setting the stored charge levels in the storage elements of the virtual cell such that the highest charge level corresponds to the $a_1$ storage element and the lowest charge level corresponds to the $a_n$ storage element. Alternatively, the virtual cell may be represented by a signal and the cell values comprise signal features, such as signal frequency, magnitude, or duration. That is, the device may receive or transmit a signal in which the signal frequency, magnitude, or duration is modified over time so as to define cells or bins, wherein the portion of the signal having the greatest frequency, magnitude, or duration is denoted the highest level cell in a corresponding permutation, and the next highest signal portion is the next highest cell, and so forth.

The next flowchart box 1304 indicates that the data storage device can be operated so as to perform a read sequence of operations to receive a permutation that corresponds to a codeword and determine a corresponding data value. Box 1304 represents a read sequence that includes operations of receiving a permutation comprising as values that define a codeword given by A, where A=[$a_1, a_2, \ldots, a_n$] integer values and determining a data value that corresponds to the codeword. In the case of a device that stores data in memory cells, the read sequence 1304 operations may include comparing the stored charge levels of the storage elements, identifying the storage element with the greatest stored charge level, and determining a set of values that corresponds to the permutation A stored in the virtual cell. Reading data by simply determining rank ordering of storage element charge levels for determining a permutation that corresponds to data values is potentially much faster than determining exact voltage levels of storage elements to determine corresponding data values.

Box 1306 shows that the storage device can also be operated so as to perform a program sequence of operations to receive data from a host device and program (write or store) the data into the device. Box 1306 represents a program sequence that includes increasing the stored charged level of one storage element in the virtual cell from a current charge level to an increased charge level, such that the increased charge level is greater than the stored charge level of any other storage element. Storing data by increasing the stored charge level of one storage element to the highest charge level of any storage element within a virtual cell, a "push-to-top" operation, is potentially much faster than changing the charge level to be an exact voltage level, which may involve initially performing a block erasure operation. As noted, the "push-to-top" operation also greatly reduces the risk of overshooting the desired exact voltage level, which requires a block erasure operation. Thus, rank modulation coding vastly reduces the need for block erasure during write operations.

The operations of programming a value into the data storage device may include joint coding operations such that multiple storage elements are used to represent multiple data items (also called variables) in a joint way (namely, the storage elements are not necessarily separated into groups with each group representing one variable separately). The multiple data items may be rewritten with different frequencies. The permutations of the storage elements are mapped to the multiple data items. Furthermore, the permutations of the storage elements can be partial ordering, which is a special case of permutation where some storage elements are not compared and so the relative orders between them do not matter. The coding of the plurality of storage elements may include storage elements designated as index cells, reference cell, or cells representing integers such that the stored data items are some linear combinations of those integers. It should be apparent that any joint coding operations that were performed upon programming data values into the data storage device will likewise be performed upon reading from the data storage device.

Box 1308 shows an optional uniform stored charge reduction operation that is unique to rank modulation code storage devices that have memory cells. The uniform stored charge reduction operation can further reduce block erasure operations, and comprises decreasing the stored charge level in all the storage elements in a virtual cell by a constant charge amount that is less than the lowest stored charge level of the storage elements. This operation can be performed during idle times or as background processing. Uniformly reducing the stored charge levels of all storage elements within a virtual cell will not change the relative rank ordering and therefore will not change the stored value of the virtual cell. This is useful because, without it, when a storage element of a virtual cell reaches its maximum stored charge value, it can no longer accommodate a change in value, and therefore all storage elements in that virtual cell must have their stored charge levels reduced, or otherwise erased so that program operations for the virtual cell can start anew. Uniform charge reduction can be carried out by a controller of the storage device. This can essentially eliminate the need for block erasure operations in a rank modulation code device.

Figure 14:
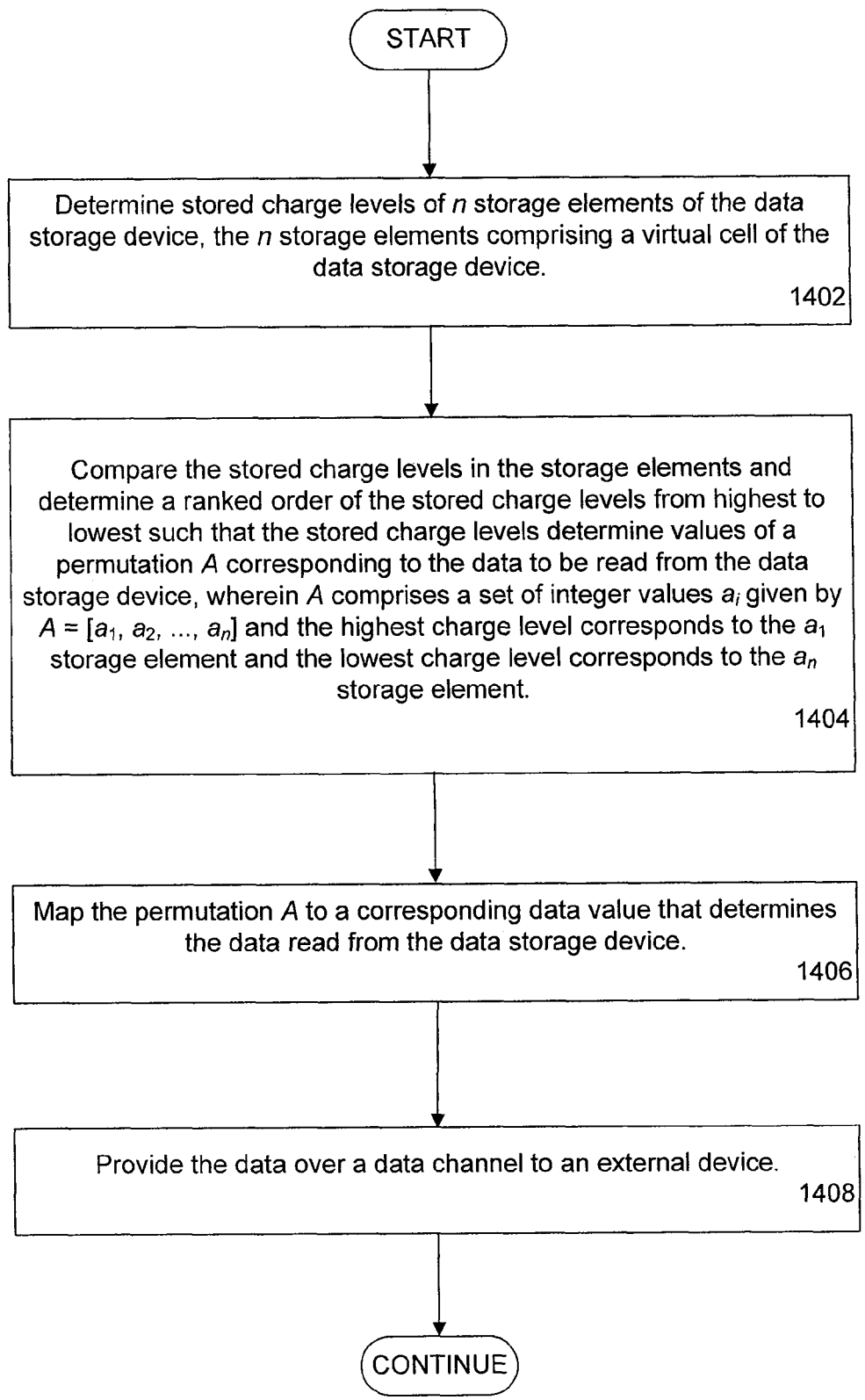
FIG. 14 is a flow diagram that shows reading operations of a data storage device constructed in accordance with the description herein.

FIG. 14 is a flow diagram that shows reading operations of a data storage device that includes storage elements such as memory cells. The reading operations will determine charge levels of the n storage elements in a virtual cell so as to identify a corresponding permutation of integer values $a_i$ given by $A=[a_1, a_2, \ldots, a_n]$. The permutation then determines a corresponding data value. In the first operation, indicated by box 1402, the data storage device determines the stored charge levels of the n storage elements comprising a virtual cell of the data storage device. The techniques used for determining stored charge levels in devices may be conventional techniques, which should be understood without further explanation.

Next, at box 1404, the data storage device compares the stored charge levels in the storage elements and determines a ranked order of the stored charge levels from highest to lowest such that the stored charge levels determine values of the permutation A corresponding to the data to be read from the data storage device. As noted, the permutation A comprises a set of integer values as given by $A=[a_1, a_2, \ldots, a_n]$ such that the highest charge level corresponds to the $a_1$ storage element and the lowest charge level corresponds to the $a_n$ storage element.

At box 1406, the storage device maps the permutation A to a corresponding data value that determines the data read from the data storage device. The mapping comprises a transition function $t_i$ given by $$t_i(a_1, \ldots, a_{i-1}, a_i, a_{i+1}, \ldots, a_n) = [a_i, a_1, \ldots, a_{i-1}, a_{i+1}, \ldots, a_n],$$

thereby comprising a length-n Rank Modulation Gray Code (n-RMGC) having n! states. As described in previous sections, the n-RMGC can be generated in such a way that it is a cyclic and complete code, or it may be generated so that it is cyclic, complete, and balanced. For a given code generating methodology (i.e., programming operation), the read operations may comprise inverse operations to the code generation. That is, if a particular methodology is used to generate a permutation A given a received data value x for storage, then a reverse set of operations may be carried out to generate a data value x given a permutation A. Such inverse operations will be apparent to those skilled in the art in view of the description herein. Lastly, at box 1408, the storage device provides the data value over a data channel to a host device.

The rank modulation code may be implemented for an information channel comprising a transmitted signal, rather than comprising a data connection to memory cells. In that situation, the operations of FIG. 14 would be performed analogously. For example, the read operation (box 1402) corresponds to receiving a signal and determining signal features, rather than reading memory cell charge levels. The signal features can comprise modulation of the signal frequency, magnitude, or duration over time. The comparing operation (box 1404) relates to determining a rank ordering of the signal features. Thus, in the case of using signal frequency, the highest detected signal frequency over a predetermined duration defines the highest cell value, the next highest detected signal frequency defines the next highest cell value, and so forth, to determine a permutation comprising a codeword. Lastly (box 1406), the determined permutation is mapped to a data value.

Figure 15:
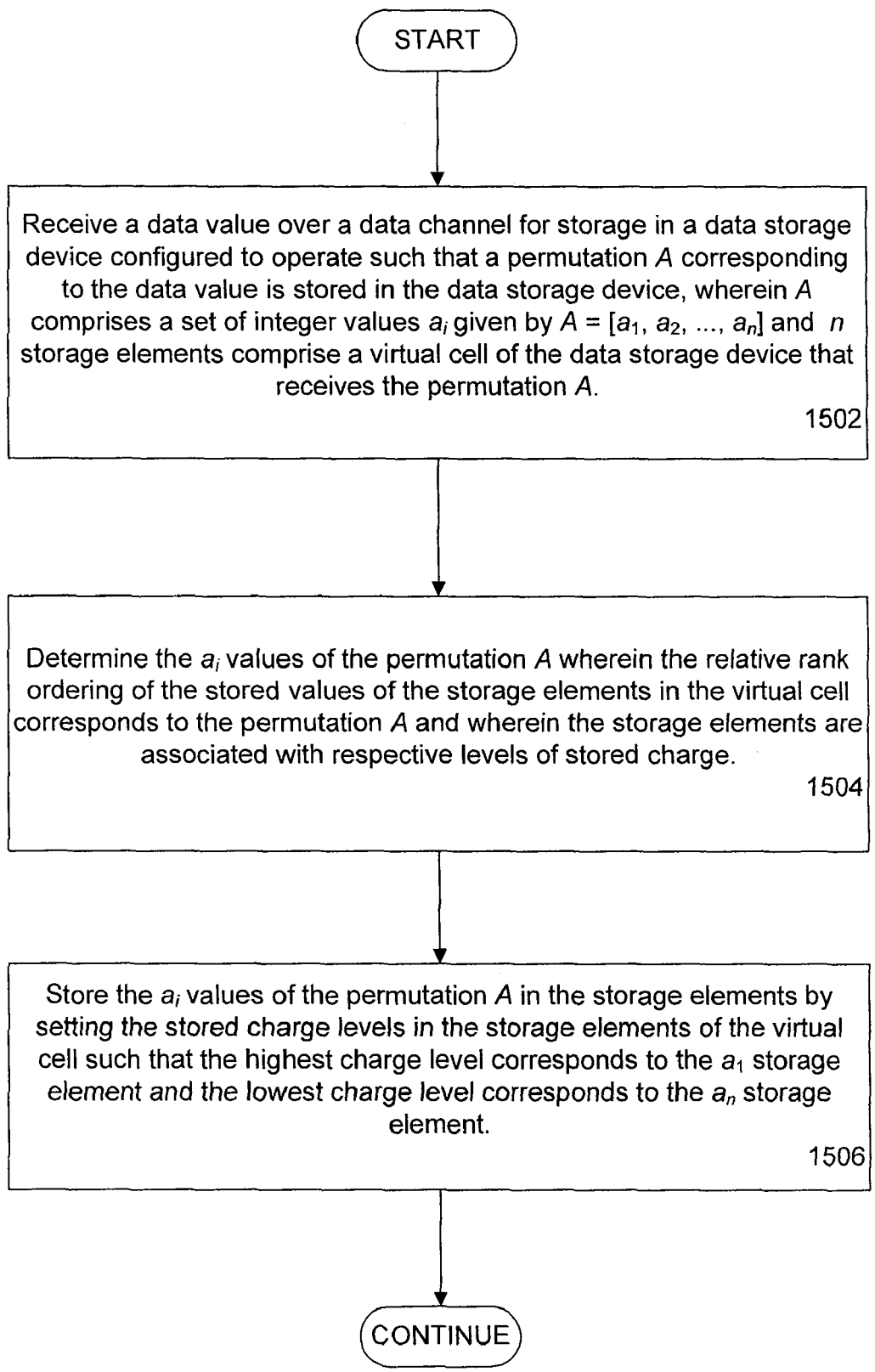
FIG. 15 is a flow diagram that shows programming operations of a data storage device constructed in accordance with the description herein.

FIG. 15 is a flow diagram that shows programming operations of a data storage device that includes storage elements such as memory cells. The programming operations will operate on a received data value, determine a corresponding permutation A of integer values $a_i$, for i=1, ..., n, and will program the storage elements in a virtual cell of the data storage device to correspond to the permutation. In the first operation, indicated by box 1502, the data storage device receives the data value over a data channel for storage in the data storage device, which is configured to operate such that a permutation A corresponding to the data value is stored in the data storage device, wherein A comprises a set of integer values $a_i$ given by A=$[a_1, a_2, ..., a_n]$ and n storage elements comprise a virtual cell of the data storage device that receives the permutation A.

Box 1504 indicates that the next program operation is to determine the $a_i$ values of the permutation A for storing the $a_i$ values into a plurality of storage elements of the data storage device, wherein relative rank ordering of the stored values of the storage elements in the virtual cell corresponds to the permutation A and wherein the storage elements are associated with respective levels of stored charge. The permutation can be determined in accordance with rank modulation codes as described previously, which may include cyclic and complete codes, and balanced, cyclic, and complete codes, using the techniques described previously. In particular, the rank modulation code may comprise an n-RMGC type of code for n storage elements within a virtual cell.

Also as noted previously, the permutation to be stored can be determined in accordance with a joint coding scheme such that multiple storage elements are used to represent multiple data items (also called variables) in a joint way. The data items can be rewritten at different rewrite rates (rewrite frequencies), and the permutations can be coded according to partial ordering. In such cases, the permutation may be determined so as to include a plurality of storage elements designated as index cells, reference cell, or cells representing integers such that the stored data items are some linear combinations of those integers.

Box 1506 indicates that the next program operation comprises storing the $a_i$ values of the permutation A in the storage elements. This operation is performed by setting the stored charge levels in the storage elements of the virtual cell such that the highest charge level corresponds to the $a_1$ storage element and the lowest charge level corresponds to the $a_n$ storage element. In this way, the program operation stores the permutation A in the storage elements of the virtual cell by raising the charge level of the i-th storage element of the virtual cell, for $2 \leq i \leq n$, above the current highest ranking charge level according to a transition function $t_i$ given by $$t_i(a_1, ..., a_{i-1}, a_i, a_{i+1}, ..., a_n) = [a_i, a_1, ..., a_{i-1}, a_{i+1}, ..., a_n]$$

thereby comprising a lengthen Rank Modulation Gray Code (n-RMGC) having n! states. In general, raising the charge level of the i-th storage element comprises increasing the stored charge level by a predetermined incremental amount. The precision needed for the incremental amount, however, is greatly reduced over conventional data storage techniques for multi-level cells, because the incremental amount need only be sufficient to distinguish relative ranking of the stored charge level of the storage elements within a virtual cell.

The rank modulation code may be implemented for an information channel comprising a transmitted signal, rather than comprising a data connection to memory cells. In that situation, the operations of FIG. 15 would be performed analogously. The data value receiving operation (box 1502) would still comprise receiving a data value for encoding, except that the data values would comprise signal modulations for transmission over a communications channel, rather than storing in memory cells. Similarly, determining the values of a permutation (box 1504) would still be performed, albeit for purposes of signal modulation rather than setting charge level. Thus, the operation of setting charge level (box 1506) would instead comprise transmitting a signal that is modulated according to the predetermined signal feature to be manipulated (e.g., signal frequency, magnitude, or duration). The details of such operations will be known to those skilled in the art.

Figure 16:
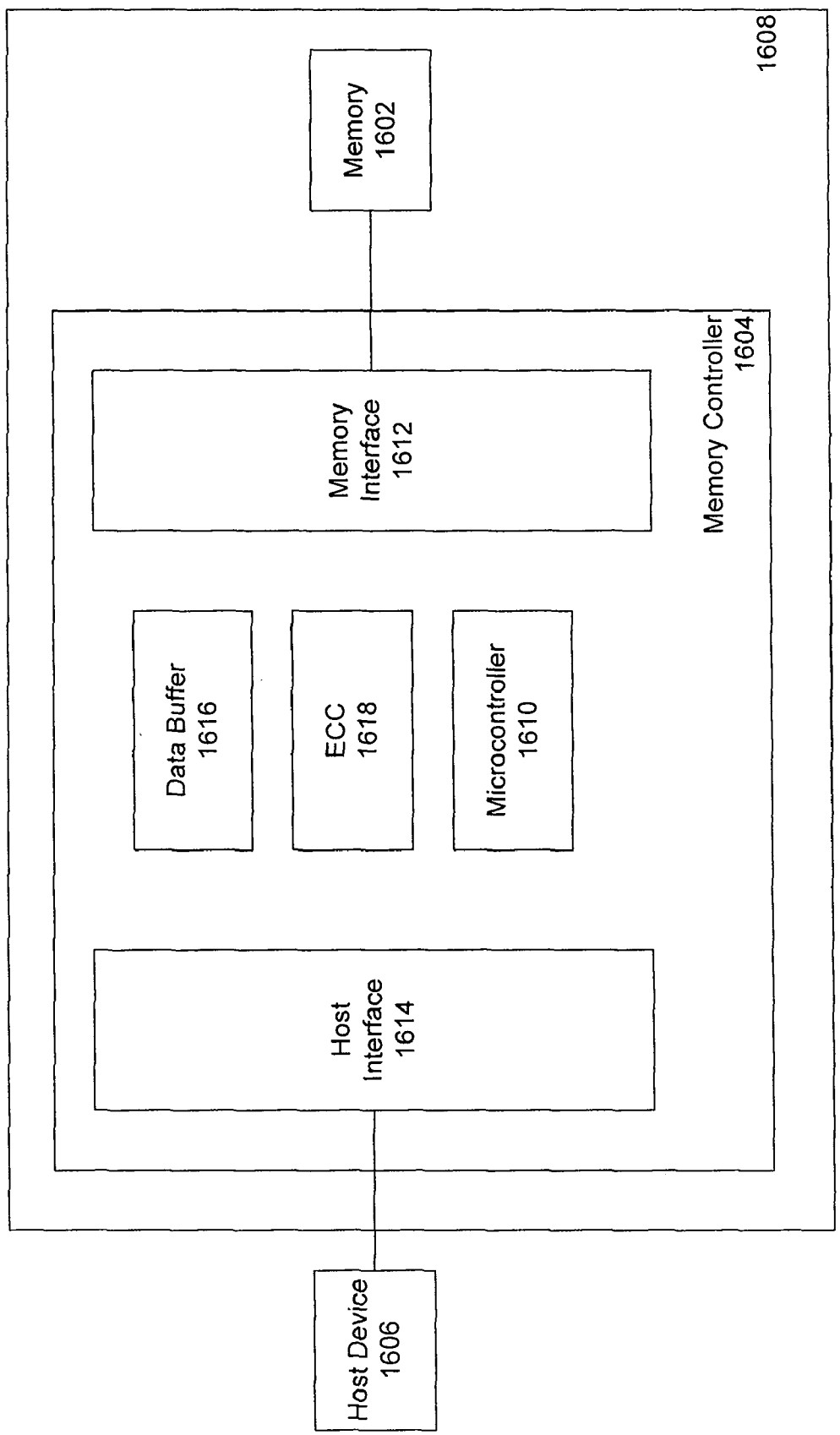
FIG. 16 is an illustration of a memory device constructed in accordance with the present invention.

FIG. 16 is an illustration of a data device constructed in accordance with the present invention. FIG. 16 shows a memory 1602 that is accessed by a memory controller 1604 that communicates with a host device 1606. The memory 1602 is used for storing data that is represented in accordance with a rank modulation coding scheme. The memory may be implemented, for example, as a Flash memory having multi-level cells. The memory 1602 and memory controller 1604 together comprise a data storage device 1608 that may be external to the host device or may be integrated with the host device into a single component or system. For example, the data storage device 1608 may comprise a Flash memory device (often referred to as a "thumb drive") that communicates with a host computer 1606 via a USB connection, or the data storage device may comprise a solid state drive (SSD) that stores data for a host computer system. Alternatively, the data storage device may be integrated with a suitable host device to comprise a single system or component with rank modulation memory, such as a smart phone, network router, MP3 player, or the like.

The memory controller 1604 operates under control of a microcontroller 1610, which manages communications with the memory 1602 via a memory interface 1612 and manages communications with the host device via a host interface 1614. Thus, the memory controller supervises data transfers from the host 1606 to the memory 1602 and from the memory 1602 to the host 1606. The memory controller 1604 also includes a data buffer 1616 in which data values may be temporarily stored for transmission over the data channel controller 1617 between the memory 1602 and the host 1606. The memory controller also includes an ECC block 1618 in which data for the ECC is maintained. For example, the ECC block 1618 may comprise data and program code to perform error correction operations for rank modulation code. Such error correction operations are described, for example, in the U.S. patent application entitled "Error Correcting Codes for Rank Modulation" by Anxiao Jiang et al. filed Nov. 20, 2008. The ECC block 1618 may contain parameters for the error correction code to be used for the memory 1602, such as programmed operations for translating between received symbols and error-corrected symbols, or the ECC block may contain lookup tables for codewords or other data, or the like. The memory controller 1604 performs the operations described above for decoding data and for encoding data.

The operations described above for operating a data storage device, for reading data from a device, for programming a data storage device, and encoding and decoding, can be carried out by the operations depicted in FIGS. 13, 14, and 15, which can be performed by the microcontroller 1610 and associated components of the data storage device 1608. For example, in an implementation of the rank modulation coding scheme in a USB thumb drive, all the components of the data storage device 1608 depicted in FIG. 16 are contained within the USB thumb drive.

Figure 17:
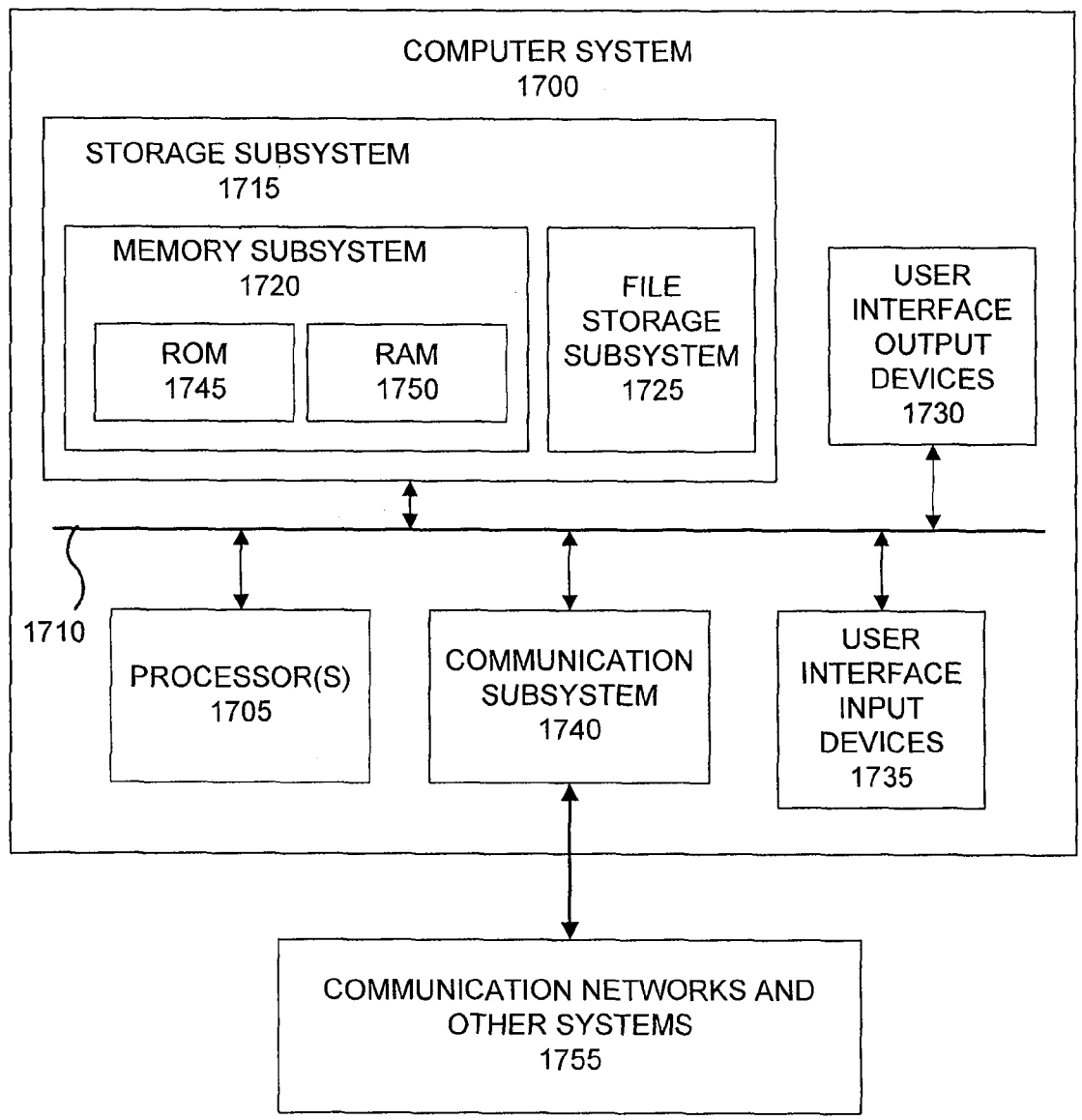
FIG. 17 is a block diagram of a computer apparatus to perform the operations of FIGS. 13, 14, and 15 and for communicating with a memory device such as depicted in FIG. 16.

The processing components such as the controller 1604 and microcontroller 1610 may be implemented in the form of control logic in software or hardware or a combination of both, and may comprise processors that execute software program instructions from program memory, or as firmware, or the like. The host device 1606 may comprise a conventional computer apparatus. A conventional computer apparatus also may carry out the operations of FIGS. 13, 14, and 15. FIG. 17 is a block diagram of a computer apparatus 1700 sufficient to perform as a host device and sufficient to perform the operations of FIGS. 13, 14, and 15.

FIG. 17 is a block diagram of a computer system 1700 that may incorporate embodiments of the present invention and perform the operations described herein. The computer system 1700 typically includes one or more processors 1705, a system bus 1710, storage subsystem 1715 that includes a memory subsystem 1720 and a file storage subsystem 1725, user interface output devices 1730, user interface input devices 1735, a communications subsystem 1740, and the like.

In various embodiments, the computer system 1700 typically includes conventional computer components such as the one or more processors 1705. The file storage subsystem 1725 can include a variety of memory storage devices, such as a read only memory (ROM) 1745 and random access memory (RAM) 1750 in the memory subsystem 1720, and direct access storage devices such as disk drives. As noted, the direct access storage device may comprise a rank modulation data storage device that operates as described herein.

The user interface output devices 1730 can comprise a variety of devices including flat panel displays, touchscreens, indicator lights, audio devices, force feedback devices, and the like. The user interface input devices 1735 can comprise a variety of devices including a computer mouse, trackball, trackpad, joystick, wireless remote, drawing tablet, voice command system, eye tracking system, and the like. The user interface input devices 1735 typically allow a user to select objects, icons, text and the like that appear on the user interface output devices 1730 via a command such as a click of a button or the like.

Embodiments of the communication subsystem 1740 typically include an Ethernet card, a modem (telephone, satellite, cable, ISDN), (asynchronous) digital subscriber line (DSL) unit, FireWire (IEEE 1394) interface, USB interface, and the like. For example, the communications subsystem 1740 may be coupled to communications networks and other external systems 1755 (e.g., a network such as a LAN or the Internet), to a FireWire bus, or the like. In other embodiments, the communications subsystem 1740 may be physically integrated on the motherboard of the computer system 1700, may be a software program, such as soft DSL, or the like.

The RAM 1750 and the file storage subsystem 1725 are examples of tangible media configured to store data such as error correction code parameters, codewords, and program instructions to perform the operations described herein when executed by the one or more processors, including executable computer code, human readable code, or the like. Other types of tangible media include program product media such as floppy disks, removable hard disks, optical storage media such as CDs, DVDs, and bar code media, semiconductor memories such as flash memories, read-only-memories (ROMs), battery-backed volatile memories, networked storage devices, and the like. The file storage subsystem 1725 includes reader subsystems that can transfer data from the program product media to the storage subsystem 1715 for operation and execution by the processors 1705.

The computer system 1700 may also include software that enables communications over a network (e.g., the communications network 1755) such as the DNS, TCP/IP, UDP/IP, and HTTP/HTTPS protocols, and the like. In alternative embodiments, other communications software and transfer protocols may also be used, for example IPX, or the like.

It will be readily apparent to one of ordinary skill in the art that many other hardware and software configurations are suitable for use with the present invention. For example, the computer system 1700 may be a desktop, portable, rack-mounted, or tablet configuration. Additionally, the computer system 1700 may be a series of networked computers. Further, a variety of microprocessors are contemplated and are suitable for the one or more processors 1705, such as PENTIUM™ microprocessors from Intel Corporation of Santa Clara, Calif., USA; OPTERON™ or ATHLON XP™ microprocessors from Advanced Micro Devices, Inc. of Sunnyvale, Calif., USA; and the like. Further, a variety of operating systems are contemplated and are suitable, such as WINDOWS®V, WINDOWS XP®V, WINDOWS VISTA®, or the like from Microsoft Corporation of Redmond, Wash., USA, SOLARIS® from Sun Microsystems, Inc. of Santa Clara, Calif., USA, various Linux and UNIX distributions, and the like. In still other embodiments, the techniques described above may be implemented upon a chip or an auxiliary processing board (e.g., a programmable logic device or graphics processor unit).

The present invention can be implemented in the form of control logic in software or hardware or a combination of both. The control logic may be stored in an information storage medium as a plurality of instructions adapted to direct an information-processing device to perform a set of steps disclosed in embodiments of the present invention. Based on the disclosure and teachings provided herein, a person of ordinary skill in the art will appreciate other ways and/or methods to implement the present invention.

The rank modulation scheme described herein can be implemented in a variety of systems for encoding and decoding data for transmission and storage. That is, codewords are received from a source over an information channel according to a rank modulation scheme and are decoded into their corresponding data values and provided to a destination, such as a memory or a processor, and data values for storage or transmission are received from a source over an information channel and are encoded into a rank modulation scheme.

Figure 18:
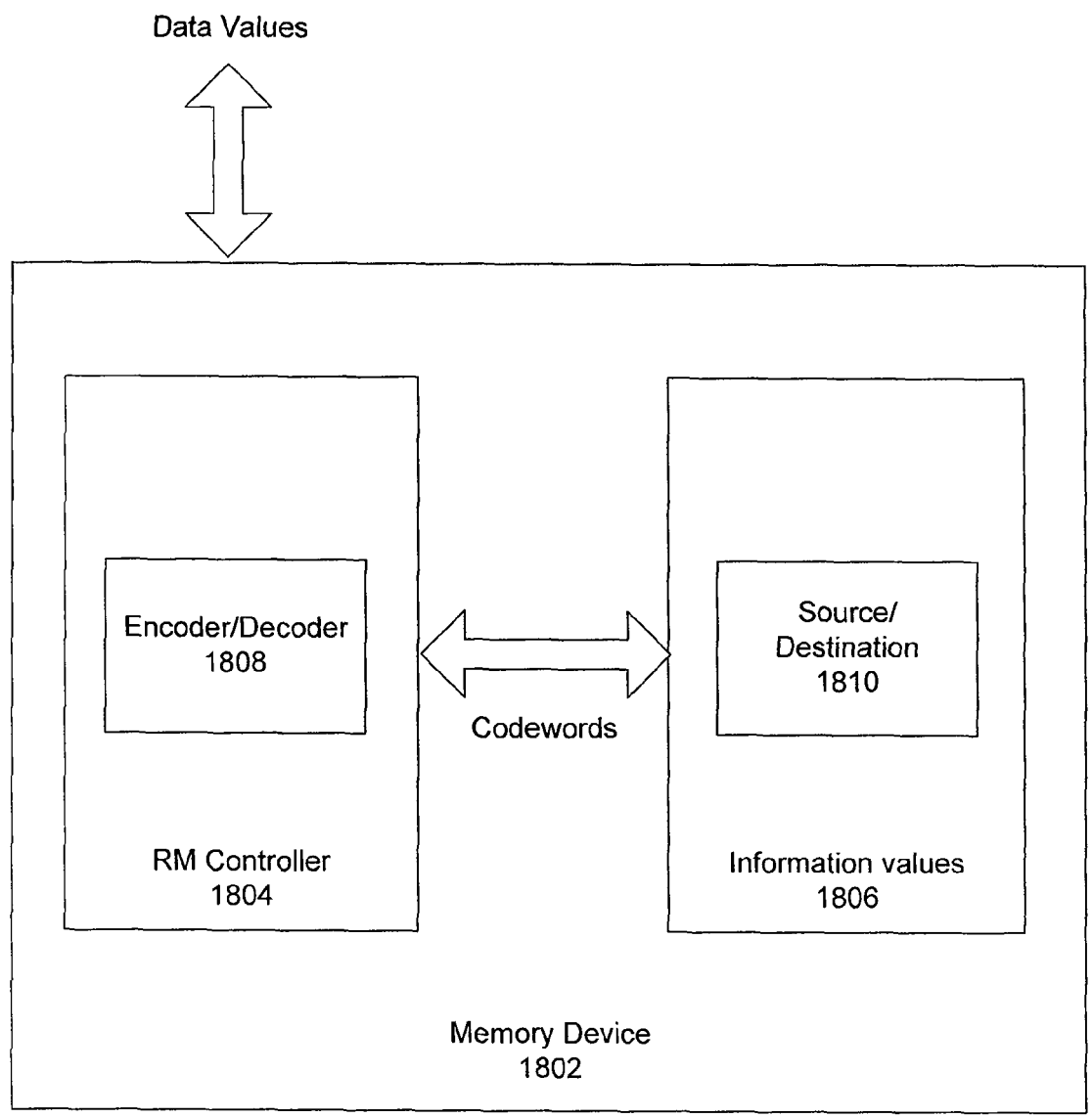
FIG. 18 is a block diagram that shows data flow in a memory device that operates according to the rank modulation scheme described herein.

The operations of encoding and decoding data according to the rank modulation scheme can be illustrated as in FIG. 18, which shows data flow in a data device 1802 that operates according to the rank modulation scheme described herein. In FIG. 18, the device includes a Rank Modulation (RM) controller 1804 that stores and retrieves information values 1806. The RM controller 1804 includes an encoder and decoder 1808 for encoding data values into codewords and decoding codewords into data values. The RM controller encodes data values and provides codewords to the source/destination block 1810, and decodes codewords from the source/destination and provides corresponding data values. The two-way nature of the data flow is indicated by the double-ended arrows labeled "data values" and "codewords". The RM controller includes interfaces through which the RM controller receives and provides the data values and the information values (codewords). The details of such interfaces will be known to those skilled in the art.

The information values 1806 comprise the means for physically representing data comprising the data values and codewords. For example, the information values 1806 may represent charge levels of memory cells, such that multiple cells are configured to operate as a virtual cell in which charge levels of the cells determine a permutation of the rank modulation code. Data values are received and encoded to permutations of a rank modulation code and charge levels of cells are adjusted accordingly, and rank modulation codewords are determined according to cell charge levels, from which a corresponding data value is determined. Alternatively, the information values 1806 may represent features of a transmitted signal, such as signal frequency, magnitude, or duration, such that the cells or bins are defined by the signal features and determine a permutation of the rank modulation code. For example, rank ordering of detected cell frequency changes over time can determine a permutation, wherein the highest signal frequency denotes the highest cell level. Other schemes for physical representation of the cells will occur to those skilled in the art, in view of the description herein.

For information values 1806 in the case of cell charge levels, the source/destination 1810 comprises memory cells in which n memory cells provide n cell values whose charge levels define a rank modulation permutation. For storing a codeword, the memory cells receive an encoded codeword and comprise a destination, and for reading a codeword, the memory cells provide a codeword for decoding and comprise a source. In the case of data transmission, the source/destination 1810 may comprise a transmitter/receiver that processes a signal with signal features such as frequency, magnitude, or duration that define cells or bins such that the signal features determine a permutation. That is, signal components comprising signal frequency, magnitude, or duration may be controlled and modulated by the transmitter such that a highest signal frequency component or greatest magnitude component or greatest time component corresponds to a highest cell level, followed by signal component values that correspond to other cell values and thereby define a permutation of the rank modulation code. When the source/destination 1810 receives a codeword from the controller 1804, the source/destination comprises a transmitter of the device 1802 for sending an encoded signal. When the source/destination provides a codeword to the controller 1804 from a received signal, the source/destination comprises a receiver of the device for receiving an encoded signal. Those skilled in the art will understand how to suitably modulate signal components of the transmitted signal to define rank modulation code permutations, in view of the description herein.

VIII. Conclusion

In this paper, we present a new data storage scheme, rank modulation, for flash memories. We show several Gray code constructions for rank modulation, as well as data rewriting schemes and the joint coding technique. One important application of the Gray codes is the realization of logic multi-level cells. For data rewriting, an optimal code for the worst-case performance is presented. It is also shown that to optimize the average rewrite cost, a prefix-free code can be constructed in polynomial time that approximates an optimal solution well under mild conditions. Joint coding can balance the load of cells and reduce block erasures even when the variables are rewritten with different frequencies. In summary, the rank modulation scheme can substantially improve the speed, reliability and longevity of flash memories due to its novel properties.

The embodiments discussed herein are illustrative of one or more examples of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the scope of the present invention. Hence, the present descriptions and drawings should not be considered in a limiting sense, as it is understood that the present invention is in no way limited to only the embodiments illustrated.

We claim:

1. A computer method of operating a data device, the method comprising:
   receiving a data value to be encoded into a codeword, wherein the codeword indicates n cell values that comprise a virtual cell in which relative rank ordering of the n cell values determines a permutation comprising one of n! permutations;
   generating a permutation A corresponding to the codeword, wherein A is given by $A=[a_1, a_2, \ldots, a_n]$ integer values such that the $[a_1, a_2, \ldots, a_n]$ permutation conforms to a rank modulation scheme for data representation in which the $a_i$ values are arranged in rank order; and
   providing the permutation to a data destination over an information channel.

2. A method as in claim 1, wherein the data destination comprises a transmitter that transmits a signal containing the codewords and the information channel comprises a communication channel over which the transmitter transmits the signal.

3. A method as in claim 2, wherein the n cell values comprise a feature of the signal, selected from among signal features comprising signal frequency or signal magnitude or signal duration.

4. A method as in claim 1, wherein the receiver comprises a memory in a data device and the information channel comprises a data connection of the data device.

5. A method as in claim 4, wherein the n cell values are associated with storage elements of the memory having respective levels of charge comprising n memory cells of the data device.

6. A method as in claim 5, wherein the $a_i$ values of the permutation A are stored in the storage elements in accordance with setting the stored charge levels in the storage elements of the virtual cell such that the highest charge level corresponds to the $a_1$ value and the lowest charge level corresponds to the $a_n$ value.

7. A method as in claim 5, wherein storing the $a_i$ values of the permutation A in the storage elements comprises setting the stored charge levels in the storage elements of the virtual cell such that the highest charge level corresponds to the $a_1$ storage element and the lowest charge level corresponds to the $a_n$ storage element.

8. A method as in claim 1, further including a read sequence comprising:
   receiving a permutation comprising $a_i$ values that define a codeword given by A, where $A=[a_1, a_2, \ldots, a_n]$ integer values;
   determining a data value that corresponds to the codeword.

9. A method as in claim 1, wherein the n cell values comprise charge levels of n memory cells of the data device and the $a_i$ values correspond to the charge levels.

10. A method as in claim 9, wherein the n cell values comprise a feature of a signal, the n cell values selected from among signal features comprising signal frequency or signal magnitude or signal duration, and the $a_i$ values correspond to the signal features.

11. A method as in claim 1, wherein the n cell values are associated with storage elements having respective levels of stored charge, the method further including a program sequence comprising increasing the stored charged level of one storage element in the virtual cell from a current charge level to an increased charge level, such that the increased charge level is greater than the stored charge level of any other storage element.

12. A method as in claim 1, wherein the n cell values are associated with storage elements having respective levels of stored charge, the method further including decreasing the stored charge level in all the storage elements by a substantially uniform charge amount that is less than the lowest stored charge level of the storage elements.

13. A method as in claim 1, further including a program sequence comprising changing the permutation A given by $A=[a_1, a_2 \ldots, a_n]$ integer values by increasing the value of the i-th element of the virtual cell, for $2 \leq i \leq n$, above the current highest ranking value.

14. A method as in claim 13, wherein the i-th element of the virtual cell whose value is increased is determined according to a rank modulation code defined by:

determining a value $p(n, l)$ that represents the minimum number of value increased operations that produce at least l permutations, where $p(n, l)$ is given by the smallest integer such that $|B_{p(n, l)}{}^n| \geq l$;

selecting l distinct prefix sequences $a_1, \ldots, a_l$, each of length $p(n, l)$ and selected such that a prefix sequence $P_n(a)$ that is a subset of the state space S comprises all the permutations in $S_n$ that start with the sequence a;

mapping the l distinct prefixes to l different values such that for each $i \in [l]$ and $s \in P_n(a_i)$, an interpretation function $\phi$ generates a value such that $\phi(s)=i$ where the interpretation function $\phi$: $W_n \to [l]$ maps every state $s \in W_n$ to a value $\phi(s)$ in [l] for a $W_n$ comprising a set of permutations that are used to represent data, such that for a current state $s \in W_n$ and a new information symbol $i \in [l]$, an update function $\mu$: $W_n \times [l] \to W_n$ produces a state $\mu(s, i)$;

generating a next code word using the update function $\mu$ such that, given $s \in W_n$ and some $i \in [l]$, setting the permutation $[a_i^{(1)}, a_i^{(2)}, \ldots, a_i^{(p(n,l))}]$ as the first $p(n, l)$ elements which appear in all the permutations in $P_n(a_i)$ and applying a push-to-the-top operation on the permutation elements $a_i^{(p(n,l))}, \ldots, a_i^{(2)}, a_i^{(1)}$ in s to produce a permutation $s' \in P_n(a_i)$ for which $\phi(s')=i$, and $\mu(s, i)=s'$.

15. A method as in claim 13, wherein the i-th element of the virtual cell whose value is increased is determined according to a rank modulation code defined by:

computing a set of opt functions given by $opt_i(x, m)$, for $i=1, 2, \ldots, n-1, x=0, 1, \ldots, l$, and $m=0, 1, \ldots, \min\{l, n!/(n-i)!\}$ for a permutation tree T of a code, wherein $opt_i(x, m)$ provides a minimum value for a subtree of T whose value is defined as the weighted average length for leaves x of a subtree in a layer i having no more than m vertices in the layer i, wherein the set of opt functions are defined according to:

when $i = n - 1$ and $m \geq x > 0$, $$opt_i(x, m) = (n-1) \sum_{k=1}^{x} p_k;$$

when $i \geq 1$ and $x = 0$, $$opt_i(x, m) = 0;$$

when $x > m \cdot (n - i)!$, $$opt_i(x, m) = \infty; \text{ and}$$

when $i < n - 1$ and $0 < x \leq m \cdot (n - i)!$, $$opt_i(x, m) = \min_{0 \leq j \leq \min\{x, m\}} \left\{ opt_{i+1}(x - j, \min\{l, (m - j) \cdot (n - i)\}) + \sum_{k=x-j+1}^{x} i p_k \right\},$$

such that the set of opt functions specifies a number of leaves for each layer in an optimal code tree; and selecting the number of leaves for each layer of the code tree as specified by the opt functions and assigning code words to the leaves.

16. A method as in claim 13, wherein increasing the value of the i-th element comprises increasing the value by a predetermined incremental amount.

17. A method as in claim 13, wherein the n cell values comprise charge levels of n memory cells of the data device and the $a_i$ values correspond to the charge levels.

18. A method as in claim 13, wherein the n cell values comprise a feature of a signal, the n cell values selected from among signal features comprising signal frequency or signal magnitude or signal duration, and the $a_i$ values correspond to the signal features.

19. A method as in claim 13, wherein the i-th element of the virtual cell whose value is increased is determined according to a rank modulation code that comprises an n-RMGC code such that, for a state space S and a set of transition functions T, where every $t \in T$ is a function t such that t: $S \to S$, the code is produced by operations comprising:

setting the first permutation of the code to be the integer set $[1, 2, 3, \ldots, n]$;

recursively applying the transition function $t_i$ a total of n−1 times beginning with the first permutation to construct n−1 blocks, each block containing (n−1)! permutations, such that every block satisfies requirements that (1) the second element in the first permutation and the first element in the last permutation are 2, and (2) $t_{i(n-1)!} = t_2$, thereby defining a cyclic and complete code.

20. A method as in claim 19, wherein the code is specified by a cyclic and complete (n−1)-RMGC defined by transitions $t_{i_1}, \ldots, t_{i_{(n-1)!}}$, wherein the code is determined by transitions comprising:

$$t_{jk} = \begin{cases} t_{n-i_{\lceil k/n \rceil}+1} & k \equiv 1 \pmod{n} \\ t_n & \text{otherwise,} \end{cases}$$

for all $k \in \{1, \ldots, n!\}$, thereby defining a cyclic, complete, and balanced code.

21. A method as in claim 20, wherein each successive permutation in the code is produced from a current permutation and is determined by a function specified by Function Successor having arguments $(n, [a_1, a_2, \ldots, a_n])$, wherein the Function Successor comprises a function that receives as input a value n, where n∈N, n≧2 for a permutation $[a_1, a_2, \ldots, a_n]$, and produces an output i such that i∈{2,...,n} and determines the transition $t_i$ to the next permutation in the balanced recursive n-RGMC in accordance with a sequence of operations comprising
if n=2 then
    return 2;
else
    if $a_1 \neq n$ then
        return n;
    else
        return n—Function Successor (n−1, $[a_n, a_{n-1}, \ldots, a_2]$)+1.

22. A method as in claim 1, wherein at least two data values are associated with a single permutation, thereby providing a joint coding scheme.

23. A method as in claim 1, wherein the storage elements of the virtual cell may include a plurality of storage elements designated as index cells, at least one storage element designated as a reference cell, and a plurality of storage elements representing integers such that the stored data comprises a linear combination of the integers.

24. A method as in claim 1, wherein the integers represent a permutation that includes partial ordering.

25. A method as in claim 1, wherein generating a permutation A comprises performing a table lookup operation to identify a permutation stored in a permutation data table and generating the stored permutation as the permutation A.

26. A data device comprising:
means for physically representing data;
a controller that is configured to receive a data value to be encoded into a codeword provided to the means for physically representing data, wherein the codeword indicates n cell values that comprise a virtual cell in which relative rank ordering of the n cell values determines a permutation comprising one of n! permutations, the controller further configured to generate a permutation A corresponding to the codeword, wherein A is given by $A=[a_1, a_2, \ldots, a_n]$ integer values such that the $[a_1, a_2, \ldots, a_n]$ permutation conforms to a rank modulation scheme for data representation in which the $a_i$ values are arranged in rank order, and to provide the permutation to a data destination over an information channel.

27. A device as in claim 26, wherein the data destination comprises a transmitter that transmits a signal containing the codewords and the information channel comprises a communication channel over which the transmitter transmits the signal.

28. A device as in claim 27, wherein the n cell values comprise a feature of the signal, selected from among signal features comprising signal frequency or signal magnitude or signal duration.

29. A device as in claim 26, wherein the receiver comprises a memory in a data device and the information channel comprises a data connection of the data device.

30. A device as in claim 26, wherein the n cell values are associated with storage elements of the memory having respective levels of charge comprising n memory cells of the data device.

31. A device as in claim 30, the $a_i$ values of the permutation A are stored in the storage elements in accordance with setting the stored charge levels in the storage elements of the virtual cell such that the highest charge level corresponds to the $a_1$ value and the lowest charge level corresponds to the $a_n$ value.

32. A device as in claim 31, wherein the controller stores the $a_i$ values of the permutation A in the storage elements by setting the stored charge levels in the storage elements of the virtual cell such that the highest charge level corresponds to the $a_1$ storage element and the lowest charge level corresponds to the $a_n$ storage element.

33. A device as in claim 26, wherein the controller performs a read sequence comprising:
receiving a permutation comprising $a_i$ values that define a codeword given by A, where $A=[a_1, a_2, \ldots, a_n]$ integer values;
determining a data value that corresponds to the codeword.

34. A device as in claim 26, wherein the n cell values comprise charge levels of n memory cells of the data device and the $a_i$ values correspond to the charge levels.

35. A device as in claim 34, wherein the n cell values comprise a feature of a signal, the n cell values selected from among signal features comprising signal frequency or signal magnitude or signal duration, and the $a_i$ values correspond to the signal features.

36. A device as in claim 26, wherein the n cell values are associated with storage elements having respective levels of stored charge, the controller further performs a program sequence comprising increasing the stored charged level of one storage element in the virtual cell from a current charge level to an increased charge level, such that the increased charge level is greater than the stored charge level of any other storage element.

37. A device as in claim 26, wherein the n cell values are associated with storage elements having respective levels of stored charge, the method further including decreasing the stored charge level in all the storage elements by a substantially uniform charge amount that is less than the lowest stored charge level of the storage elements.

38. A device as in claim 26, wherein the controller performs changing the permutation A given by $A=[a_1, a_2, \ldots, a_n]$ integer values by increasing the value of the i-th element of the virtual cell, for $2 \leq i \leq n$, above the current highest ranking value.

39. A device as in claim 38, wherein the controller determines the i-th element for increase according to a rank modulation code defined by:
determining a value p(n, l) that represents the minimum number of charge operations that produce at least l permutations, where p(n, l) is given by the smallest integer such that $|B_{p(n,l)}{}^n| \geq l$;
selecting l distinct prefix sequences $a_1, \ldots, a_l$, each of length p(n, l) and selected such that a prefix sequence $P_n(a)$ that is a subset of the state space S comprises all the permutations in $S_n$ that start with the sequence a;
mapping the l distinct prefixes to l different values such that for each i∈[l] and s∈$P_n(a_i)$, an interpretation function φ generates a value such that φ(s)=i where the interpretation function φ: $W_n \to [l]$ maps every state s∈$W_n$ to a value φ(s) in [l] for a $W_n$ comprising a set of permutations that are used to represent data, such that for a current state s∈$W_n$ and a new information symbol i∈[l], an update function μ: $W_n \times [l] \to W_n$ produces a state μ(s, i);
generating a next code word using the update function μ such that, given s∈$W_n$ and some i∈[l], setting the permutation $[a_i^{(1)}, a_i^{(2)}, \ldots, a_i^{(p(n,l))}]$ as the first p(n, l) elements which appear in all the permutations in $P_n(a_i)$ and applying a push-to-the-top operation on the permutation elements $a_i^{(p(n,l))}, \ldots, a_i^{(2)}, a_i^{(1)}$ in s to produce a permutation s'∈$P_n(a_i)$ for which φ(s')=i, and μ(s, i)=s'.

40. A device as in claim 38, wherein the controller determines the i-th element for increase according to a rank modulation code defined by:
computing a set of opt functions given by $opt_i(x, m)$, for $i=1, 2, \ldots, n-1, x=0, 1, \ldots, 1$, and $m=0, 1, \ldots, \min\{1, n!/(n-i)!\}$ for a permutation tree T of a code, wherein $opt_i(x, m)$ provides a minimum value for a subtree of T whose value is defined as the weighted average length for leaves x of a subtree in a layer i having no more than m vertices in the layer i, wherein the set of opt functions are defined according to:

when $i = n - 1$ and $m \geq x > 0$, $$opt_i(x, m) = (n - 1) \sum_{k=1}^{x} p_k;$$

when $i \geq 1$ and $x = 0$, $$opt_i(x, m) = 0;$$

when $x > m \cdot (n - i)!$, $$opt_i(x, m) = \infty; \text{ and}$$

when $i < n - 1$ and $0 < x \leq m \cdot (n - i)!$, $$opt_i(x, m) = \min_{0 \leq j \leq \min\{x, m\}} \left\{ opt_{i+1}(x - j, \min\{l, (m - j) \cdot (n - i)\}) + \sum_{k=x-j+1}^{x} ip_k \right\},$$

such that the set of opt functions specifies a number of leaves for each layer in an optimal code tree; and
selecting the number of leaves for each layer of the code tree as specified by the opt functions and assigning code words to the leaves.

41. A device as in claim 38, wherein the controller increases the value of the i-th element by increasing the value by a predetermined incremental amount.

42. A device as in claim 38, wherein the n cell values comprise charge levels of n memory cells of the data device and the $a_i$ values correspond to the charge levels.

43. A device as in claim 38, wherein the n cell values comprise a feature of a signal, the n cell values selected from among signal features comprising signal frequency or signal magnitude or signal duration, and the $a_i$ values correspond to the signal features.

44. A device as in claim 38, wherein the controller determines the i-th element for increase according to a rank modulation code defined by an n-RMGC code such that, for a state space S and a set of transition functions T, where every $t \in T$ is a function t such that: $S \to S$, the code is produced by controller operations comprising:
setting the first permutation of the code to be the integer set $[1, 2, 3, \ldots, n]$;
recursively applying the transition function $t_i$ a total of n−1 times beginning with the first permutation to construct n−1 blocks, each block containing (n−1)! permutations, such that every block satisfies requirements that
(1) the second element in the first permutation and the first element in the last permutation are 2, and
(2) $t_{i(n-1)!} = t_2$,
thereby defining a cyclic and complete code.

45. A device as in claim 44, wherein the code is specified by a cyclic and complete (n−1)-RMGC defined by transitions $t_{i_1}, \ldots, t_{i_{(n-1)!}}$, wherein the code is determined by transitions comprising:

$$t_{jk} = \begin{cases} t_{n-i_{\lfloor k/n \rfloor}+1} & k \equiv 1 \pmod{n} \\ t_n & \text{otherwise,} \end{cases}$$

for all $k \in \{1, \ldots, n!\}$, thereby defining a cyclic, complete, and balanced code.

46. A device as in claim 45, wherein each successive permutation in the code is produced from a current permutation and is determined by a function specified by Function Successor having arguments $(n, [a_1, a_2, \ldots, a_n])$, wherein the Function Successor comprises a function that receives as input a value n, where $n \in N$, $n \geq 2$ for a permutation $[a_1, a_2, \ldots, a_n]$, and produces an output i such that $i \in \{2, \ldots, n\}$ and determines the transition $t_i$ to the next permutation in the balanced recursive n-RGMC in accordance with a sequence of operations comprising
if n=2 then
  return 2;
else
  if $a_1 \neq n$ then
    return n;
  else
    return n—Function Successor (n−1, $[a_n, a_{n-1}, \ldots, a_2]$)+1.

47. A device as in claim 26, wherein at least two data values are associated with a single permutation, thereby providing a joint coding scheme.

48. A device as in claim 26, wherein the storage elements of the virtual cell may include a plurality of storage elements designated as index cells, at least one storage element designated as a reference cell, and a plurality of storage elements representing integers such that the stored data comprises a linear combination of the integers.

49. A device as in claim 48, wherein the integers represent a permutation that includes partial ordering.

50. A device as in claim 26, wherein the controller generates a permutation A comprises performing a table lookup operation to identify a permutation stored in a permutation data table and generating the stored permutation as the permutation A.

51. A method of programming a data value for storage, the method comprising:
receiving the data value over a data channel for storage in a data storage device configured to operate such that a permutation A corresponding to the data value is stored in the data storage device, wherein A comprises a set of integer values $a_i$ given by $A = [a_1, a_2, \ldots, a_n]$ and n storage elements comprise a virtual cell of the data storage device that receives the permutation A;

determining the $a_i$ values of the permutation A for storing the $a_i$ values into a plurality of storage elements of the data storage device, wherein relative rank ordering of the stored values of the storage elements in the virtual cell corresponds to the permutation A and wherein the storage elements are associated with respective levels of stored charge;

storing the $a_i$ values of the permutation A in the storage elements by setting the stored charge levels in the storage elements of the virtual cell such that the highest charge level corresponds to the $a_1$ storage element and the lowest charge level corresponds to the $a_n$ storage element.

52. A method as in claim 51, wherein storing further comprises increasing the stored charged level of one storage element in the virtual cell from a current charge level to an increased charge level, such that the increased charge level is greater than the stored charge level of any other storage element.

53. A method as in claim 52, wherein storing comprises raising the charge level of the i-th storage element of the virtual cell, for $2 \leq i \leq n$, above the current highest ranking charge level.

54. A method as in claim 53, wherein the i-th element of the virtual cell whose value is increased is determined according to a rank modulation code that comprises an n-RMGC code such that, for a state space S and a set of transition functions T, where every $t \in T$ is a function t such that t: S→S, the code is produced by operations comprising:

setting the first permutation of the code to be the integer set [1, 2, 3, . . . , n];

recursively applying the transition function $t_i$ a total of n−1 times beginning with the first permutation to construct n−1 blocks, each block containing (n−1)! permutations, such that every block satisfies requirements that (1) the second element in the first permutation and the first element in the last permutation are 2, and (2) $t_{i(n-1)!} = t_2$, thereby defining a cyclic and complete code.

55. A method as in claim 30, wherein the i-th element of the virtual cell whose value is increased is determined according to a rank modulation code defined by:

determining a value p(n, 1) that represents the minimum number of charge operations that produce at least l permutations, where p(n, 1) is given by the smallest integer such that $|B_{p(n,l)}{}^n| \geq l$;

selecting l distinct prefix sequences $a_1, \ldots, a_l$, each of length p(n, 1) and selected such that a prefix sequence $P_n(a)$ that is a subset of the state space S comprises all the permutations in $S_n$ that start with the sequence a;

mapping the l distinct prefixes to l different values such that for each $i \in [l]$ and $s \in P_n(a_i)$, an interpretation function φ generates value such that φ(s)=i where the interpretation function φ: $W_n$→[l] maps every state $s \in W_n$ to a value φ(s) in [l] for a $W_n$ comprising a set of permutations that are used to represent data, such that for a current state $s \in W_n$ and a new information symbol $i \in [l]$, an update function μ: $W_n \times [l]$→$W_n$ produces a state μ(s, i);

generating a next code word using the update function, such that given $s \in W_n$ and some $i \in [l]$, setting the permutation $[a_i{}^{(1)}, a_i{}^{(2)}, \ldots, a_i{}^{(p(n,l))}]$ as the first p(n, 1) elements which appear in all the permutations in $P_n(a_i)$ and applying a push-to-the-top operation on the permutation elements $a_i{}^{(p(n,l))}, \ldots, a_i{}^{(2)}, a_i{}^{(1)}$ in s to produce a permutation $s' \in P_n(a_i)$ for which φ(s')=i and μ(s, i)=s'.

56. A method of reading data from a data storage device, the method comprising:

determining stored charge levels of n storage elements of the data storage device, the n storage elements comprising a virtual cell of the data storage device;

comparing the stored charge levels in the storage elements and determining a ranked order of the stored charge levels from highest to lowest such that the stored charge levels determine values of a permutation A corresponding to the data to be read from the data storage device, wherein A comprises a set of integer values $a_i$ given by A=[$a_1, a_2, \ldots, a_n$] and the highest charge level corresponds to the $a_1$ storage element and the lowest charge level corresponds to the $a_n$ storage element;

mapping the permutation A to a corresponding data value that determines the data read from the data storage device;

providing the data over a data channel to a host device.

57. A method as in claim 56, further including a program sequence comprising changing the permutation A given by A=[$a_1, a_2, \ldots, a_n$] integer values by increasing the value of the i-th element of the virtual cell, for $2 \leq i \leq n$, above the current highest ranking value, wherein the n-RMGC comprises a code such that, for a state space S and a set of transition functions T, where every $t \in T$ is a function t such that t: S→S, the code is produced by operations comprising:

setting the first permutation of the code to be the integer set [1, 2, 3, . . . , n];

recursively applying the transition function $t_i$ a total of n−1 times beginning with the first permutation to construct n−1 blocks, each block containing (n−1)! permutations, such that every block satisfies requirements that (1) the second element in the first permutation and the first element in the last permutation are 2, and (2) $t_{i(n-1)!} = t_2$, thereby defining a cyclic and complete code.

58. A method as in claim 56, further including a program sequence comprising changing the permutation A given by A=[$a_1, a_2, \ldots, a_n$] integer values by increasing the value of the i-th element of the virtual cell, for $2 \leq i \leq n$, above the current highest ranking value, wherein the i-th element of the virtual cell whose value is increased is determined according to a rank modulation code defined by:

determining a value p(n, 1) that represents the minimum number of charge operations that produce at least l permutations, where p(n, 1) is given by the smallest integer such that $|B_{p(n,l)}{}^n| \geq l$;

selecting l distinct prefix sequences $a_1, \ldots, a_l$, each of length p(n, 1) and selected such that a prefix sequence $P_n(a)$ that is a subset of the state space S comprises all the permutations in $S_n$ that start with the sequence a;

mapping the l distinct prefixes to l different values such that for each $i \in [l]$ and $s \in P_n(a_i)$, an interpretation function φ generates value such that φ(s)=i where the interpretation function φ: $W_n$→[l] maps every state $s \in W_n$ to a value φ(s) in [l] for a $W_n$ comprising a set of permutations that are used to represent data, such that for a current state $s \in W_n$ and a new information symbol $i \in [l]$, an update functions μ: $W_n \times [l]$→$W_n$ produces a state μ(s, i);

generating a next code word using the update function, such that given $s \in W_n$ and some $i \in [l]$, setting the permutation $[a_i{}^{(1)}, a_i{}^{(2)}, \ldots, a_i{}^{(p(n,l))}]$ as the first p(n, 1) elements which appear in all the permutations in $P_n(a_i)$ and applying a push-to-the-top operation on the permutation elements $a_i{}^{(p(n,l))}, \ldots, a_i{}^{(2)}, a_i{}^{(1)}$ in s to produce a permutation $s' \in P_n(a_i)$ for which φ(s')=i and μ(s, i)=s'.

* * * * *